(12) United States Patent
Mukai et al.

(10) Patent No.: US 7,283,344 B2
(45) Date of Patent: Oct. 16, 2007

(54) ELECTRONIC SWITCH

(75) Inventors: Tatsuya Mukai, Tsu (JP); Nobuhiro Kitamura, Katano (JP); Yukihiro Murata, Hirakata (JP); Kenji Okada, Nishinomiya (JP)

(73) Assignee: Matsushita Electric Works, Ltd., Osaka (JP)

( * ) Notice: Subject to any disclaimer, the term of this patent is extended or adjusted under 35 U.S.C. 154(b) by 372 days.

(21) Appl. No.: 10/875,526

(22) Filed: Jun. 24, 2004

(65) Prior Publication Data
US 2005/0007715 A1 Jan. 13, 2005

(30) Foreign Application Priority Data

Jun. 25, 2003 (JP) .............. 2003-181140
Jan. 27, 2004 (JP) .............. 2004-018984

(51) Int. Cl.
*H02H 3/00* (2006.01)
(52) U.S. Cl. ..................... 361/93.1; 361/2
(58) Field of Classification Search .......... 361/2, 361/20, 23, 30, 86, 87, 93.7–93.9, 93.1, 101, 361/5
See application file for complete search history.

(56) References Cited

U.S. PATENT DOCUMENTS

| | | | |
|---|---|---|---|
| 3,742,337 A * | 6/1973 | Digneffe | 323/300 |
| 3,811,073 A * | 5/1974 | Shuey et al. | 361/86 |
| 5,239,255 A * | 8/1993 | Schanin et al. | 323/237 |
| 6,392,859 B1 * | 5/2002 | Ohshima | 361/100 |
| 2003/0197995 A1 * | 10/2003 | Hua et al. | 361/100 |

FOREIGN PATENT DOCUMENTS

JP  7-296971  11/1995

OTHER PUBLICATIONS

Patent Abstracts of Japan, Publication No. 07-296971 dated Nov. 10, 1995, 2 pgs.

* cited by examiner

*Primary Examiner*—Michael Sherry
*Assistant Examiner*—Danny Nguyen
(74) *Attorney, Agent, or Firm*—Osha Liang L.L.P.

(57) ABSTRACT

In an electronic switch which includes a pair of terminal portions 14, 14, and self arc-suppressing elements Q21, Q22 having a one-way on and off control construction connected in inverse-series between the pair of terminal portions and which turns on and off the self arc-suppressing elements Q21, Q22 with phase control, shunt resistors R51, R52 provided between the pair of terminal portions 14, 14 and connected in series to the pair of self arc-suppressing elements Q21, Q22 and thyristors S71, S72 for extracting the gate voltages applied to gates of the self arc-suppressing elements Q21, Q22 upon driving are provided. Furthermore, thyristors S71, S72 are driven by the voltages across the shunt resistors R51, R52 generated when overcurrent larger than predetermined current flows through the shunt resistors R51, R52.

17 Claims, 24 Drawing Sheets

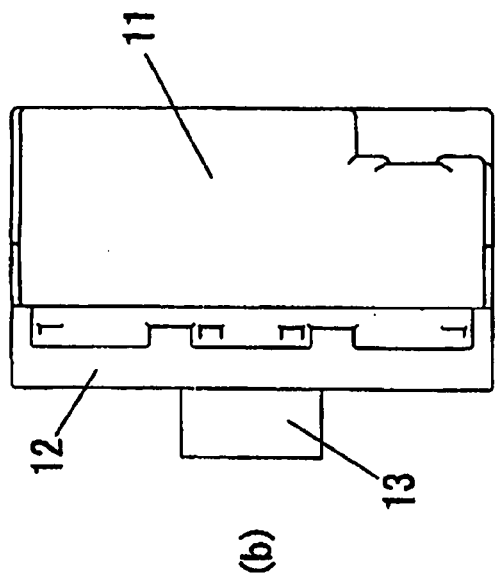
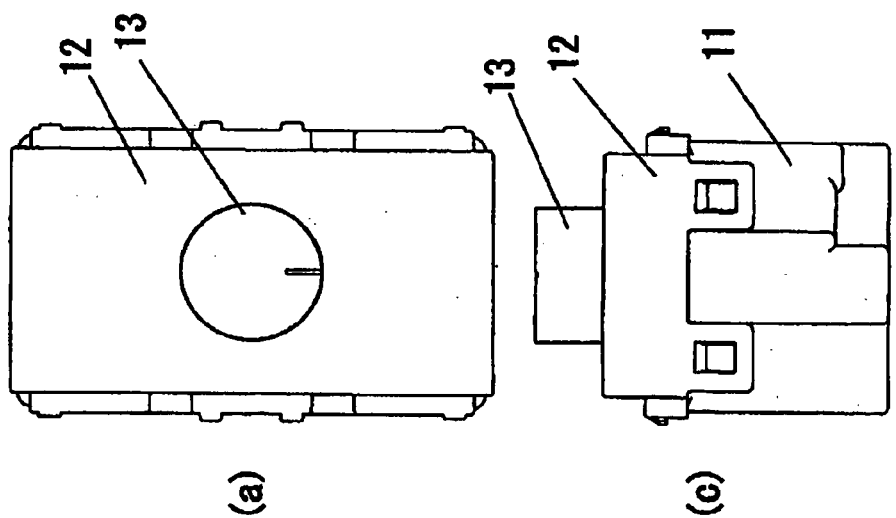
FIG. 5

FIG. 12
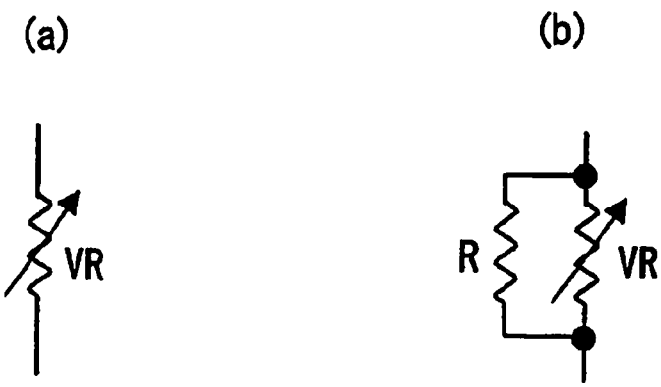
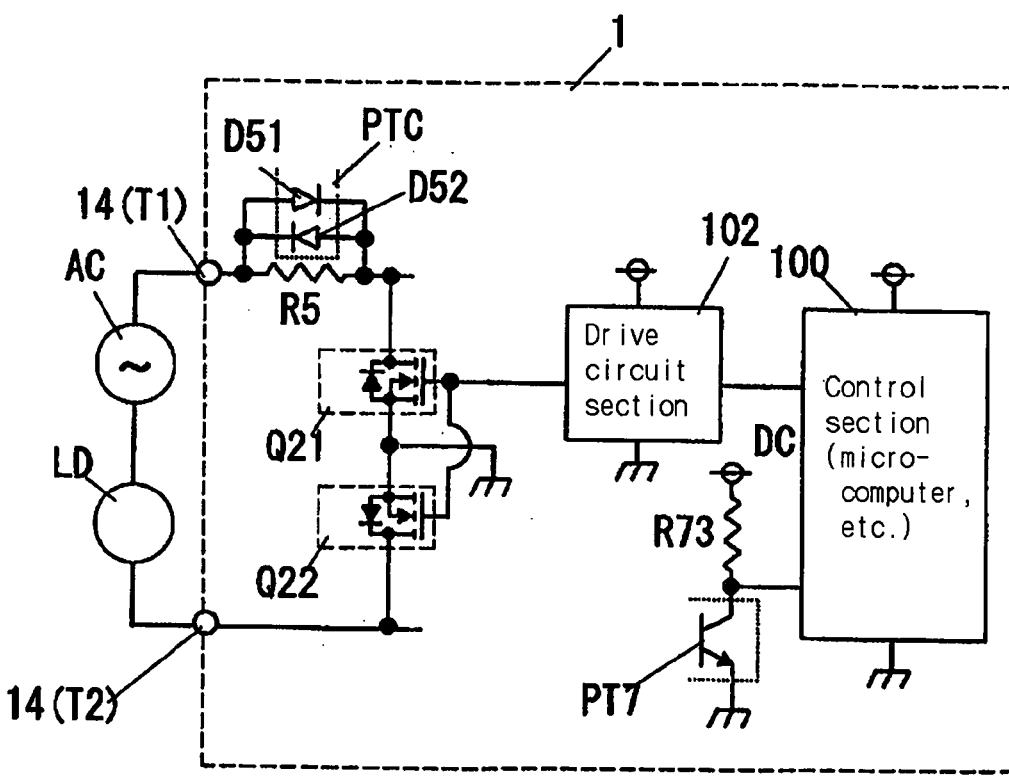
FIG. 13

ELECTRONIC SWITCH

BACKGROUND OF THE INVENTION

1. Field of the Invention

The present invention relates to an electronic switch, Which comprises a pair of self arc-suppressing elements connected in inverse-series between a pair of terminal portions to which AC power is applied through a load and which turns on or turns off the pair of self arc-suppressing elements in accordance with a phase control signal.

2. Description of the Related Art

FIG. 29 is a circuit diagram illustrating a conventional electronic switch. The electronic switch shown in FIG. 29 is provided between an AC power source AC and a load LD, and adjusts the power supply to the load LD from the AC power source AC by means of phase control. Here, the electronic switch comprises a pair of terminal portions 14, 14, a triac T connected therebetween, a diac Dk, and a volume resistor VR for adjusting a phase control angle, and turns on or turns off the triac T by means of the phase control. Further, in FIG. 29, a noise filter comprising capacitors Ca, Cb, a resistor Ra, and an inductor La is provided.

Further, an illuminating equipment comprising a serial circuit of switching elements IGBTs connected in inverse-series, two diodes connected in inverse-parallel between the drain and the source of each switching element, and an illuminating load connected to both ends of an AC power source through a serial circuit of two switching elements is disclosed in Japanese Patent Unexamined Publication JP-A 7-296971(1995). However, since the conventional electronic switch employs a triac for holding an electrical connection until current therethrough becomes zero, the conventional electronic switch has a problem that overcurrent cannot be released instantly from flowing, even when the overcurrent is detected and a driving signal of the triac is switched into stop.

SUMMARY OF THE INVENTION

The present invention is contrived to solve the above problem, and it is thus an object of the present invention to provide an electronic switch capable of instantly releasing overcurrent from flowing between a pair of terminal portions.

In order to accomplish the above object, according to the first aspect of the present invention, there is provided an electronic switch, which has a self arc-suppressing element connected between a pair of terminal portions to which AC current is applied through a load and which turns on or turns off the self arc-suppressing element with a phase control signal, the electronic switch comprising: overcurrent detection means for detecting whether current flowing between the pair of terminal portions reaches overcurrent larger than predetermined current; and overcurrent protection means for extracting the phase control signal to a control terminal of the self arc-suppressing element, when the overcurrent detection means detects that the overcurrent has been reached.

According to the above construction, since the phase control signal to the control terminal of the self arc-suppressing element is extracted when it is detected that the current flowing between the pair of terminal portions has reached the overcurrent larger than the predetermined current, it is possible to instantly release the overcurrent from flowing between the pair of terminal portions.

According to the second aspect of the present invention, there is provided an electronic switch as defined in the first aspect, wherein as the self arc-suppressing element, a pair of self arc-suppressing elements having a one-way on and off control construction are connected in inverse-series between the pair of terminal portions, wherein the electronic switch further comprises a resistor as the overcurrent detection means which is provided between the pair of terminal portions and is connected in series to the pair of self arc-suppressing elements, and a switching element as the overcurrent protection means for extracting control voltages applied to the control terminals of the self arc-suppressing elements upon driving, and wherein the switching element is driven with a voltage across the resistor generated when the overcurrent larger than the predetermined current flows through the resistor.

According to the above construction, since the switching element is driven to extract the control voltage of the self arc-suppressing element when the overcurrent flows through the resistor so that the self arc-suppressing element is turned off instantly, it is possible to instantly release the overcurrent from flowing between the pair of terminal portions.

According to the third aspect of the present invention, there is provided an electronic switch as defined in the second aspect, wherein first and second shunt resistors as the resistor are connected in series between first and second self arc-suppressing elements as the pair of self arc-suppressing elements, and first and second switching elements as the switching element are connected in series between the control terminals of the first and second self arc-suppressing elements, wherein a connection point of the first and second shunt resistors and a connection point of the first and second switching elements are connected each other, the control terminal of the first switching element is connected to a connection point of the first self arc-suppressing element and the first shunt resistor, and the control terminal of the second switching element is connected to a connection point of the second self arc-suppressing element and the second shunt resistor, wherein the first and second switching elements are driven with the voltages across the first and second shunt resistors generated when the overcurrent flows through the first and second shunt resistors.

According to the above construction, since the first and second switching elements are driven to extract the control voltage of the first and second self arc-suppressing elements when the overcurrent flows through the first and second shunt resistors so that the first and second self arc-suppressing elements are turned off instantly, it is possible to instantly release the overcurrent from flowing between the pair of terminal portions.

According to the fourth aspect of the present invention, there is provided an electronic switch as defined in the second aspect, wherein between the pair of terminal portions and first and second self arc-suppressing elements as the pair of self arc-suppressing elements, first and second shunt resistors as the resistor are provided, respectively, and first and second photo couplers each having a photo switching element as the switching element and a light emitting diode are further provided, wherein the light emitting diodes of the first and second photo couplers are connected in parallel to the first and second shunt resistors, respectively, the photo switching elements of the first and second photo couplers are connected in series between the control terminals of the first and second self arc-suppressing elements, respectively, a connection point of the first and second self arc-suppressing elements and a connection point of the photo switching elements of the first and second photo couplers are connected each other, and the control terminals of the photo switching elements of the first and second photo couplers are connected to both of the connection points, wherein the photo switching elements of the first and second photo couplers are driven, respectively, by driving the light emitting diodes of the first and second photo couplers with the voltages across the first and second shunt resistors generated when the overcurrent flows through the first and second shunt resistors.

According to the above construction, since the photo switching elements of the first and second photo couplers are driven to extract the control voltages of the first and second self arc-suppressing elements, respectively, when the overcurrent flows through the first and second shunt resistors so that the first and second self arc-suppressing elements are turned off instantly, it is possible to instantly release the overcurrent from flowing between the pair of terminal portions. Furthermore, since the first and second shunt resistors do not influence the control voltages of the first and second self arc-suppressing elements, it is ease to control finely.

According to the fifth aspect of the present invention, there is provided an electronic switch as defined in the second aspect, wherein between one terminal portion of the pair of terminal portions and one self arc-suppressing element connected to the one terminal portion of the pair of self arc-suppressing elements, the resistor is provided and a photo coupler having a photo switching element as the switching element and a pair of light emitting diodes connected in inverse-parallel is further provided, wherein the pair of light emitting diodes are connected in parallel to the resistor, the photo switching element is connected between the control terminals of the pair of self arc-suppressing elements and a connection point of the pair of self arc-suppressing elements, and the control terminals of the photo switching element is connected to the connection point, and wherein the photo switching element is driven by driving the pair of light emitting diodes with the voltage across the resistor generated when the overcurrent flows through the resistor.

According to the above construction, since the photo switching element is driven to extract the control voltages of the pair of self arc-suppressing elements when the overcurrent flows through the resistor so that the pair of self arc-suppressing elements are turned off instantly, it is possible to instantly release the overcurrent from flowing between the pair of terminal portions. Furthermore, since the resistor do not influence the control voltages of the pair of self arc-suppressing elements, it is ease to control finely. Moreover, since the number of photo coupler may be one, it is possible to make the electronic switch compact.

According to the sixth aspect of the present invention, there is provided an electronic switch as defined in the second aspect, wherein between one terminal portion of the pair of terminal portions and one self arc-suppressing element connected to the one terminal portion of the pair of self arc-suppressing elements and between the control terminals of the pair of self arc-suppressing elements and a connection point of the pair of self arc-suppressing elements, the resistor and the switching element are provided, respectively, and a photo coupler having a photo switching element and a pair of light emitting diodes connected in inverse-parallel is further provided, wherein the pair of light emitting diodes are connected in parallel to the resistor, and the photo switching element is connected between the control terminal of the switching element and a driving source, and wherein the switching element is driven by driving the pair of light emitting diodes with the voltage across the resistor generated when the overcurrent flows through the resistor to drive the photo switching element.

According to the above construction, since the switching element is driven to extract the control voltages of the pair of self arc-suppressing elements when the overcurrent flows through the resistor so that the pair of self arc-suppressing elements are turned off instantly, it is possible to instantly release the overcurrent from flowing between the pair of terminal portions. Furthermore, since the resistor do not influence the control voltages of the pair of self arc-suppressing elements, it is ease to control finely. Moreover, since the electronic switch may consist of the inexpensive photo coupler and small switching element, it is possible to save the money.

According to the seventh aspect of the present invention, there is provided an electronic switch as defined in the sixth aspect, further comprising first, second, and third resistors, first and second diodes, and a thyristor as the switching element, wherein one ends of the first resistor, the second resistor, and the thyristor are each connected to the control terminals of the pair of self arc-suppressing elements, the first diode is connected such that the first resistor is separated from the control terminals of the pair of self arc-suppressing elements when the pair of self arc-suppressing elements are turned off, the second diode is connected such that the second resistor is separated from the control terminals of the pair of self arc-suppressing elements when the pair of self arc-suppressing elements are turned on, and the third resistor is connected to one end of the thyristor to secure latch holding current.

According to the above construction, it is possible to control separately the on and off switching velocity of the self arc-suppressing elements, stop timing of the self arc-suppressing elements when the overcurrent is detected, and the holding current of the thyristor with minimum number of components.

According to the eighth aspect of the present invention, there is provided an electronic switch as defined in the first aspect, wherein as the self arc-suppressing element, a pair of self arc-suppressing elements having a one-way on and off control construction are connected in inverse-series between the pair of terminal portions, wherein the electronic switch further comprises a control section for outputting the phase control signal, and a resistor as the overcurrent detection means connected in series to the pair of self arc-suppressing elements, and wherein the control section as the overcurrent protection means stops the output of the phase control signal in accordance with the voltage across the resistor generated when the overcurrent larger than the predetermined current flows through the resistor.

According to the above construction, since the output of the phase control signal is stopped when the overcurrent flows through the resistor, it is possible to instantly release the overcurrent from flowing between the pair of terminal portions. Furthermore, in case where the control section consists of a microcomputer or CMOS-IC and the like, it is possible to save the money and make the electronic switch compact.

According to the ninth aspect of the present invention, there is provided an electronic switch as defined in the first aspect, further comprising: a diode bridge which is provided between the pair of terminal portions and the self arc-suppressing element and of which AC input terminals are connected to the pair of terminal portions, the self arc-suppressing element being connected between DC output terminals of the diode bridge; and a resistor as the overcurrent detection means provided between the DC output terminals of the diode bridge and connected in series to the self arc-suppressing element, and wherein the overcurrent protection means turns off the self arc-suppressing element with the voltage across the resistor generated when the overcurrent larger than the predetermined current flows through the resistor.

According to the above construction, since the self arc-suppressing element is turned off when the overcurrent flows through the resistor, it is possible to instantly release the overcurrent from flowing between the pair of terminal portions. Furthermore, since the number of the self arc-suppressing element and the resistor may be one, respectively, it is possible to save the money and make the electronic switch compact.

According to the tenth aspect of the present invention, there is provided an electronic switch as defined in the first aspect, further comprising: overvoltage detection means for detecting whether the voltage applied between the pair of terminal portions reaches at least an overvoltage detection level higher than the voltage of the AC power source; and overvoltage protection means for outputting a signal for suppressing the voltage between the pair of terminal portions to an overvoltage restriction level higher than the AC source voltage and lower than a withstand voltage of the self arc-suppressing element, to the control terminal of the self arc-suppressing element, independently of the phase control signal when the overvoltage detection means detects that the overvoltage has been reached.

According to the above construction, the overvoltage detection means detects that the overvoltage has been reached and the phase control signal to the control terminal of the self arc-suppressing element is extracted, so that the voltage between the pair of terminal portions rises higher than the AC source voltage by the counter electromotive force due to AC source and inductance of wiring cable to the AC source. However, since the voltage between the pair of terminal portions is suppressed to the overvoltage restriction level by the overvoltage protection means when it is detected that the voltage between the pair of terminal portions has been reached to the overvoltage restriction level, it is possible to prevent large stress from being applied to the self arc-suppressing element by the counter electromotive force due to AC source and inductance of wiring cable to the AC source upon the protection of overvoltage.

According to the eleventh aspect of the present invention, there is provided an electronic switch as defined in the tenth aspect, further comprising off holding means for holding the turned-off state of the self arc-suppressing element for a time period from a timing when the overcurrent detection means does no detect that the overcurrent has been reached to a timing when the phase control signal is changed to a signal for turning off the self arc-suppressing element.

According to the above construction, since the self arc-suppressing element can be prevented from being turned on at a timing different from a timing of original phase control by the phase control signal after a timing when the overcurrent detection means does no detect that the overcurrent has been reached, it is possible to prevent the self arc-suppressing element from being turned on except for upon zero cross of AC source in case where original phase control turns off the self arc-suppressing element upon zero cross of AC source.

According to the twelfth aspect of the present invention, there is provided an electronic switch as defined in the eleventh aspect, wherein as the self arc-suppressing element, a pair of self arc-suppressing elements having a one-way on and off control construction are connected in inverse-series between the pair of terminal portions, wherein the electronic switch further comprises a diode bridge of which both AC input terminals are connected to the pair of terminal portions and of which a negative DC output terminal is connected between the pair of self arc-suppressing elements, and wherein the overvoltage detection means includes a Zener diode of which the cathode and the anode are connected to a positive DC current output terminal of the diode bridge and both control terminals of the pair of self arc-suppressing elements, respectively, and of which a Zener voltage would be a voltage corresponding to the overvoltage detection level.

According to the above construction, since DC output voltage of the diode bridge which is provided originally can be used for monitoring AC source voltage applied between the pair of terminal portions, it is possible to constitute simply the overvoltage detection means by providing at least the Zener diode which receives the DC output voltage of the diode bridge, so that downsizing of the electronic switch is possible.

According to the thirteenth aspect of the present invention, there is provided an electronic switch as defined in the eleventh aspect, wherein as the self arc-suppressing element, a pair of self arc-suppressing elements having a one-way on and off control construction are connected in inverse-series between the pair of terminal portions, wherein the electronic switch further comprises a diode bridge of which both AC input terminals are connected to the pair of terminal portions and of which a negative DC output terminal is connected between the pair of self arc-suppressing elements, wherein the overvoltage detection means comprises an error amplifier for amplifying an error amount of the voltage level from a positive DC output terminal of the diode bridge with respect to the overvoltage detection level such as the overvoltage restriction level, and wherein the overvoltage protection means receives the output of the error amplifier and outputs a signal for suppressing the output to the overvoltage restriction level.

According to the above construction, since the voltage level between the pair of terminal portions can be suppressed to the overvoltage restriction level with high precision, it is possible to use inexpensive self arc-suppressing element having lower withstand voltage and suppress the heat generation of the self arc-suppressing element.

According to the fourteenth aspect of the present invention, there is provided an electronic switch as defined in the eleventh aspect, wherein as the self arc-suppressing element, a pair of self arc-suppressing elements having a one-way on and off control construction are connected in inverse-series between the pair of terminal portions, wherein the overcurrent detection means comprises a current-voltage converter for converting current flowing between the pair of terminal portions into a voltage and a pair of light emitting diodes connected in inverse-parallel for emitting light when the voltage converted through the current-voltage converter reaches a voltage corresponding to the overcurrent detection level which is the predetermined current level, and wherein the overcurrent protection means and the off holding means use in common a photo thyristor of which a cathode and an anode are connected between the pair of self arc-suppressing elements and to both control terminals of the pair of self arc-suppressing elements, respectively, and which is turned on through the light emitting of the light emitting diode.

According to the above construction, it is possible to constitute simply the overcurrent protection means and the off holding means by using characteristics of photo thyristor and downsize the electronic switch.

According to the fifteenth aspect of the present invention, there is provided an electronic switch as defined in the eleventh aspect, wherein as the self arc-suppressing element, a pair of self arc-suppressing elements having a one-way on and off control construction are connected in inverse-series between the pair of terminal portions, and wherein the overcurrent detection means comprises a current-voltage converter for converting current flowing between the pair of terminal portions into a voltage, and a comparator for outputting a signal indicating that the overcurrent has been reached, when the voltage converted through the current-voltage converter reaches the voltage corresponding to the overcurrent detection level which is the predetermined current level.

According to the above construction, since it is possible to detect whether the current flowing between the pair of terminal portions has been reached the overvoltage detection level with high precision, it is possible to use inexpensive self arc-suppressing element having lower withstand voltage and suppress the heat generation of the self arc-suppressing element.

According to the sixteenth aspect of the present invention, there is provided an electronic switch as defined in the fifteenth aspect, wherein the overcurrent protection means and the off holding means use the comparator in common, and the output terminal of the comparator is connected to both control terminals of the pair of self arc-suppressing elements, such that the phase control signal to both control terminals of the pair of self arc-suppressing elements is extracted and held when the signal indicating that the overcurrent has been reached is output using the signal from the overcurrent detection means as one input, and the extracting and holding of the phase control signal by the off holding means is stopped when the phase control signal is stopped using the phase control signal as the other input.

According to the above construction, since the overcurrent protection means and the off holding means can be constituted easily by means of the comparator, it is possible to downsize the electronic switch.

According to the seventeenth aspect of the present invention, there is provided an electronic switch as defined in the sixteenth aspect, wherein the overcurrent protection means comprises a switching element provided between both control terminals of the pair of self arc-suppressing elements and the ground, and the output terminal of own comparator is connected to the control terminal of the switching element.

According to the above construction, since the responsibility of extracting the phase control signal to both control terminals of the pair of self arc-suppressing elements can be enhanced and the overcurrent being rapidly raised due to the load short-circuit, etc. can be restricted to a small current value to intercept the current, it is possible to use the self arc-suppressing elements lower in cost and size.

According to the eighteenth aspect of the present invention, there is provided an electronic switch as defined in the fifteenth aspect, wherein the overcurrent detection means comprises a differential circuit section for differentiating the voltage converted through own current-voltage converter, the differential circuit section being provided between own current-voltage converter and the comparator.

According to the above construction, in a case where the current being rapidly raised is generated, the overcurrent small enough can be determined as the overcurrent by the differential circuit section.

According to the nineteenth aspect of the present invention, there is provided an electronic switch as defined in the tenth aspect, further comprising counting means for counting the number of times per a predetermined unit time when the overcurrent detection means detects that the overcurrent has been reached, wherein when the number of times per a unit time counted by the counting means reaches a predetermined number, the output of the phase control signal to both control terminals of the pair of self arc-suppressing elements is stopped.

According to the above construction, since any disorder can be considered as being generated when the number of times per unit time reaches the predetermined number, it is possible to prevent the electronic switch from operating in a state where a disorder can be considered as being generated by stopping the output of the phase control signal, and in addition, it is possible to reduce the power consumption.

According to the twentieth aspect of the present invention, there is provided an electronic switch as defined in the tenth aspect, wherein as the self arc-suppressing element, a pair of self arc-suppressing elements having a one-way on and off control construction are connected in inverse-series between the pair of terminal portions, wherein the electronic switch further comprises: a diode bridge of which both AC input terminals are connected to the pair of terminal portions and of which a negative DC output terminal is connected between the pair of self arc-suppressing elements; an internal power circuit section comprising a transistor of which one end is connected to a positive DC output terminal of the diode bridge and of which the control terminal is connected to the negative DC output terminal of the diode bridge, and a smoothing capacitor connected between the control terminal and the other end of the transistor, the internal power circuit section stabilizing a DC voltage from between both DC output terminals of the diode bridge and generating internal power; a switching element for intermittent action connected between the control terminal of the transistor of the internal power circuit section and the negative DC output terminal of the diode bridge; and a control section for outputting the phase control signal, and wherein the control section turns on the switching element for intermittent action for a part of a time period when the pair of self arc-suppressing elements are turned on by means of the phase control signal, and turns off the switching element for intermittent action for a time period other than the part of a time period.

According to the above construction, in a case where the load is an illuminating equipment and the illuminating equipment is lighted in minimum, the operation of the internal power circuit is stopped for the partial time period of the time period when the voltage between the pair of terminal portions is raised, even when the voltage between the pair of terminal portions is raised and thus the voltage between both DC output terminals of the diode bridge is raised, so that it is possible to suppress the transistor internal power circuit of the from emitting heat.

BRIEF DESCRIPTION OF THE DRAWINGS

The above and other features and advantages of the present invention will become more apparent from detailed description of exemplary embodiments thereof with reference to the attached drawings in which:

FIG. 5A is a front view of the electronic switch shown in FIG. 4, FIG. 5B is a right side view thereof.

FIG. 12 is an explanatory diagram illustrating decrease in deviation of volume resistance in the electronic switch shown in FIG. 11;

FIG. 13 is a circuit diagram illustrating an electronic switch according to a seventh embodiment of the present invention;

DETAILED DESCRIPTION OF THE PREFERRED EMBODIMENTS

Hereinafter, the present invention will be described in detail with reference to the attached drawings.

First Embodiment

Figure 1:
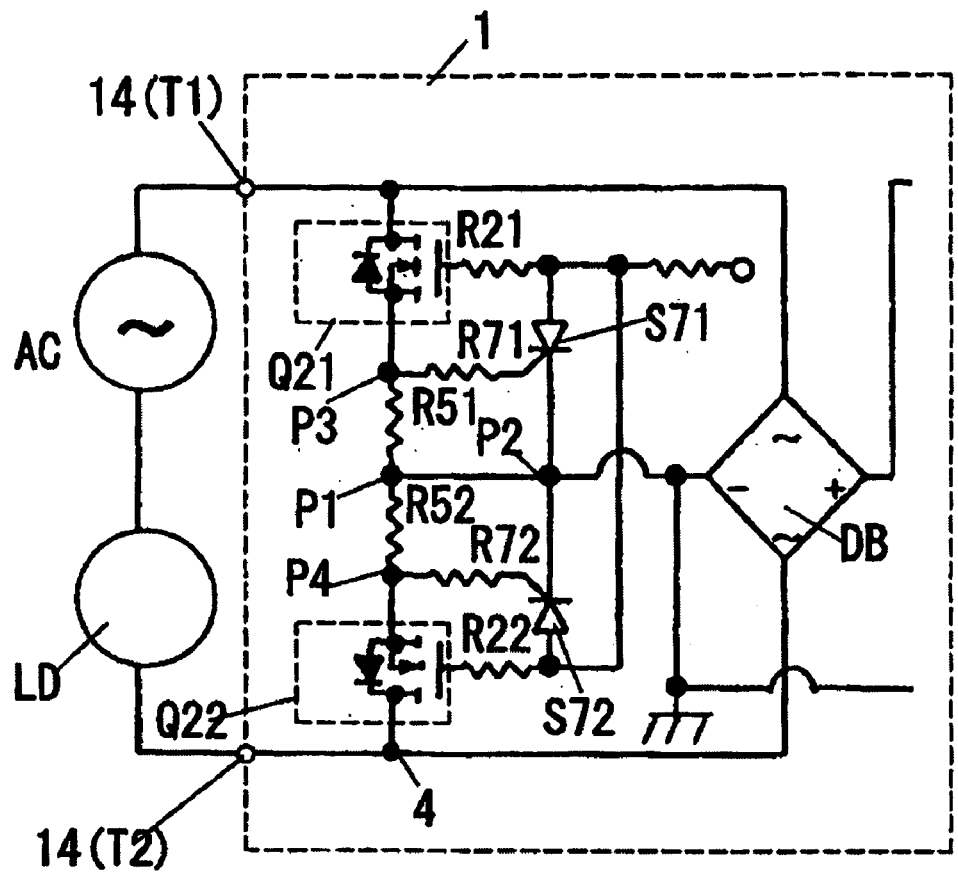
FIG. 1 is a circuit diagram illustrating a part of an electronic switch according to a first embodiment of the present invention.
Figure 2:
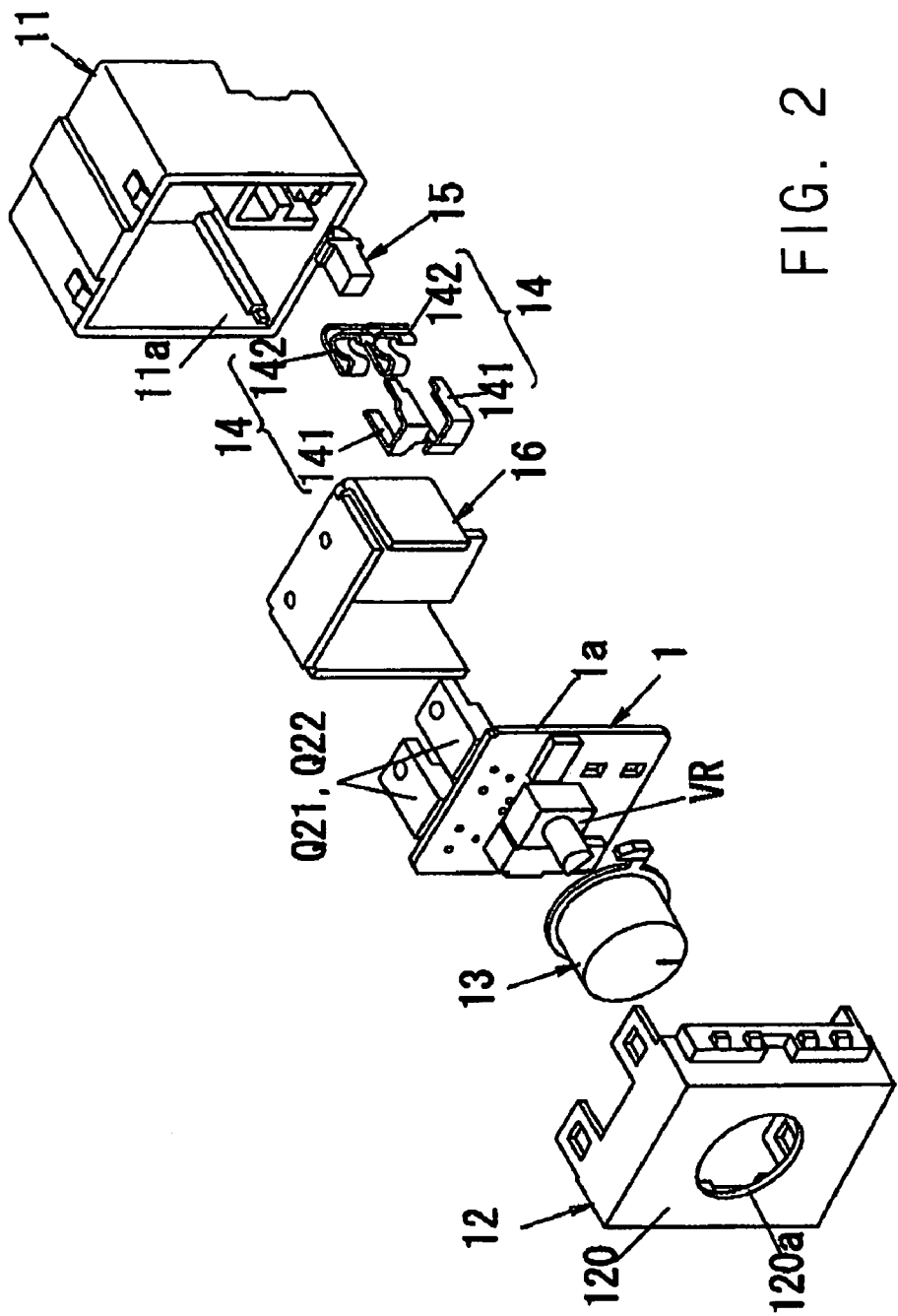
FIG. 2 is an exploded perspective view of the electronic switch shown in FIG. 1.

FIG. 1 is a circuit diagram illustrating a part of an electronic switch according to a first embodiment of the present invention, FIG. 2 is an exploded perspective view of the electronic switch shown in FIG. 1, FIG. 3A is a front view of the electronic switch shown in FIG. 1, FIG. 3B is a right side view thereof, and FIG. 3C is a lower side view thereof.

Figure 3:
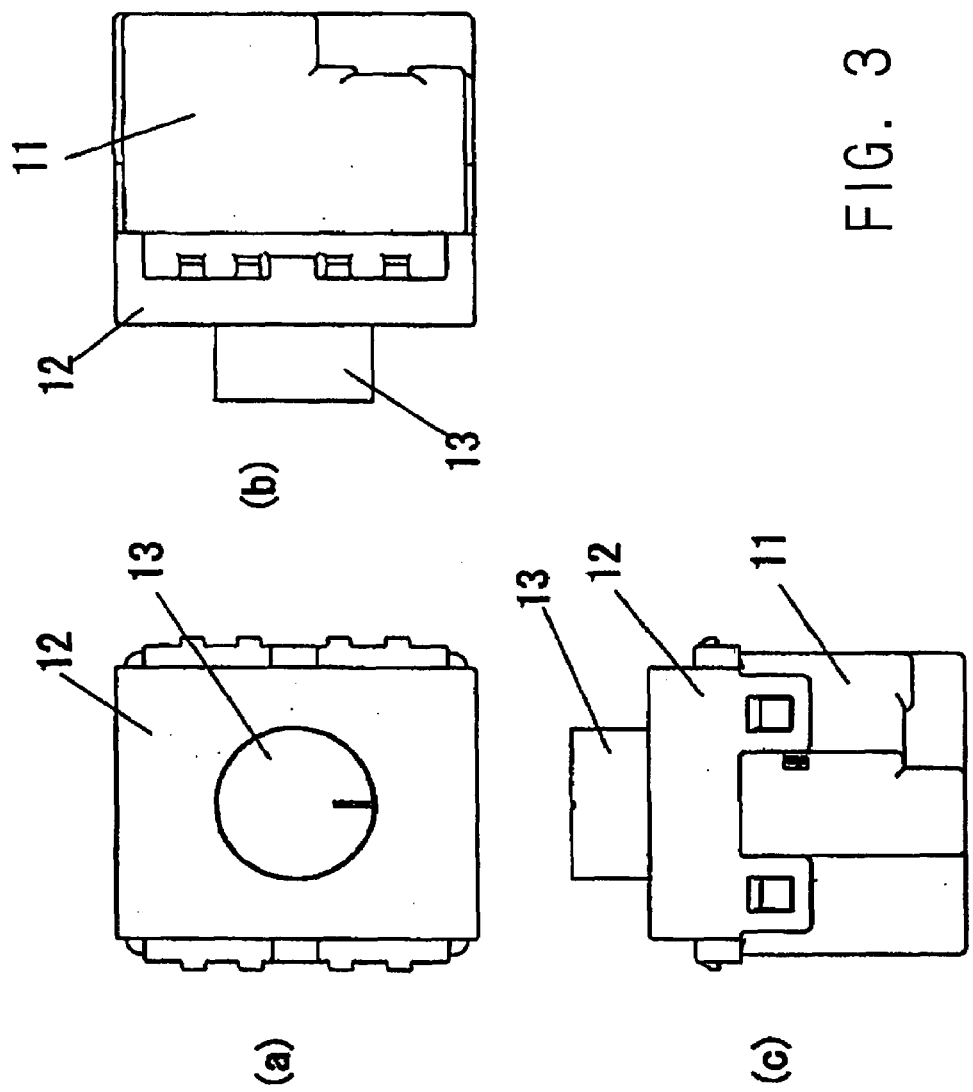
FIG. 3A is a front view of the electronic switch shown in FIG. 1.
FIG. 3B is a right side view thereof.
FIG. 3C is a lower side view thereof.

The electronic switch according to the first embodiment, as shown in FIG. 1, is provided between an AC power source AC and a load LD, and adjusts the power supply to the load LD from the AC power source AC by means of phase control. As shown in FIGS. 2 and 3, the electronic switch comprises a body 11 and a cover 12, and a handle 13, a pair of terminal portions 14, 14, a release button 15, a heat sink 16, and a circuit block 1 are received in a housing comprising the body 11 and the cover 12. In the example shown in FIGS. 2 and 3, the housing is designed to have a size corresponding to two wiring mechanisms having one module size buried in a wall.

The body 11 is formed in a box shape having an opening 11a at the front surface thereof out of insulating resin, and a pair of cable inserting holes are formed at the bottom of the body 11. The cover 12 is formed in a box shape for closing the opening 11a of the body 11 out of insulating resin, and a hole 120a for inserting the handle 13 is formed at the front surface 120 of the cover 12. The handle 13 is formed in a cylinder shape having a bottom portion out of insulating resin, and is fitted to an axis of a volume resistor VR for adjusting a phase control angle.

Each terminal portion 14 comprises a terminal plate 141 and a lock spring 142, and locks a conductive wire of an external cable inserted into the cable inserting hole, thereby obtaining an electrical connection thereto. When it is pressed with, for example, a front end of a minus driver inserted through another hole of the bottom of the body 11, the release button 15 releases the lock of the terminal portion 14 with the conductive wire. The heat sink 16 is connected mechanically to a pair of self arc-suppressing elements Q21, Q22 described later in the circuit block 1, and sinks heat thereof.

The circuit block 1 comprises a substrate 1a connected electrically to the pair of terminal portions 14, 14, and various electronic components mounted on both surfaces of the substrate. That is, as shown in FIG. 1, the self arc-suppressing elements Q21, Q22 having a one-way on and off control construction are connected in inverse-series between the pair of terminal portions 14(T1), 14(T2), and are turned on and off by means of phase control (signals) of a control section, not shown, corresponding to the volume resistor VR. Each of the self arc-suppressing elements Q21, Q22 comprises a MOS FET having a parasite diode connected in inverse-parallel thereto in the example shown in FIG. 1, and both drains of the pair of self arc-suppressing elements Q21, Q22 are connected electrically to the pair of terminal portions 14(T1), 14(T2), respectively. Each of the self arc-suppressing elements Q21, Q22 may comprise a bipolar transistor and a diode connected in inverse-parallel thereto, and may comprise an IGBT and a diode connected in inverse-parallel thereto, in place of the MOS FET.

In the first embodiment of the present invention, shunt resistors R51, R52 provided between the pair of terminal portions 14(T1), 14(T2) and connected in series to the pair of self arc-suppressing elements Q21, Q22, respectively, and thyristors S71, S72 for extracting the control voltages applied to both gates of the self arc-suppressing elements Q21, Q22 are further provided. The thyristors S71, S72 are instantly turned on by means of the voltages across the shunt resistors R51, R52 generated when overcurrent larger than predetermined current flows through the shunt resistors R51, R52.

More specifically, the pair of shunt resistors R51, R52 are connected in series between the pair of self arc-suppressing elements Q21, Q22, and the pair of thyristors S71, S72 are connected in inverse-series between both gates of the pair of self arc-suppressing elements Q21, Q22 through a pair of resistors R21, R22, wherein the cathodes of the thyristors are connected each other. A connection point P1 between the pair of shunt resistors R51, R52 and a connection point P2 between the pair of thyristors S71, S72 are connected each other. Further, the gate of the thyristor S71 at the AC power source AC side is connected to a connection point P3 between the self arc-suppressing element Q21 and the shunt resistor R51 at the AC power source AC side through a resistor R71, and the gate of the thyristor S72 at the load LD side is connected to a connection point P4 between the self arc-suppressing element Q22 and the shunt resistor R52 at the load LD side through a resistor R72. In FIG. 1, DB denotes a diode bridge.

Next, an example of an assembly order of the electronic switch having the above construction will be described. First, the pair of terminal portions 14, 14 and the release button 15 are received in a predetermined receiving room of the body 11, and the heat sink 16 attached to the circuit block 1 is received in another receiving room of the body 11. Thereafter, the handle 13 is fitted to an axis of the volume resistor VR of the circuit block 1, and the handle 13 is inserted into the hole 120a of the cover 12, so that the cover 12 is coupled to the body 11. The handle 13 may be fitted to the axis of the volume resistor VR in advance, and the terminal portions 14 may be previously or temporarily fixed to the circuit block 1.

Next, characteristic operation of the electronic switch according to the first embodiment of the present invention will be described. The electronic switch according to the first embodiment is designed, as described above, to turn on the respective thyristors S71, S72 with the voltages across the respective shunt resistors R51, R52 generated when the overcurrent larger than a predetermined current flows through the respective shunt resistors R51, R52. For this reason, when the overcurrent flows through the shunt resistor R51, R52, for example, due to the short-circuit of the load LD or the blow-out of a light bulb as the load LD, the voltages across the shunt resistors are increased over the voltage capable of turning on the thyristors S71, S72, the thyristors S71, S72 are instantly turned on, and the gate voltages of the self arc-suppressing elements Q21, Q22 are extracted, so that the self arc-suppressing elements Q21, Q22 are instantly turned off.

As a result, it is possible to instantly release the overcurrent from flowing between the pair of terminal portions 14, 14, and thus the protection of the electronic switch, the short-circuit protection, and the blow-out protection are possible. In addition, it is possible to automatically reduce inrush current (normal control is performed when it becomes warm) According to the electronic switch having the above construction, similarly to electronic switches according to other embodiments described later, it is possible to clear the standard level of a noise terminal voltage in a CISPR standard required by IEC.

Figure 4:
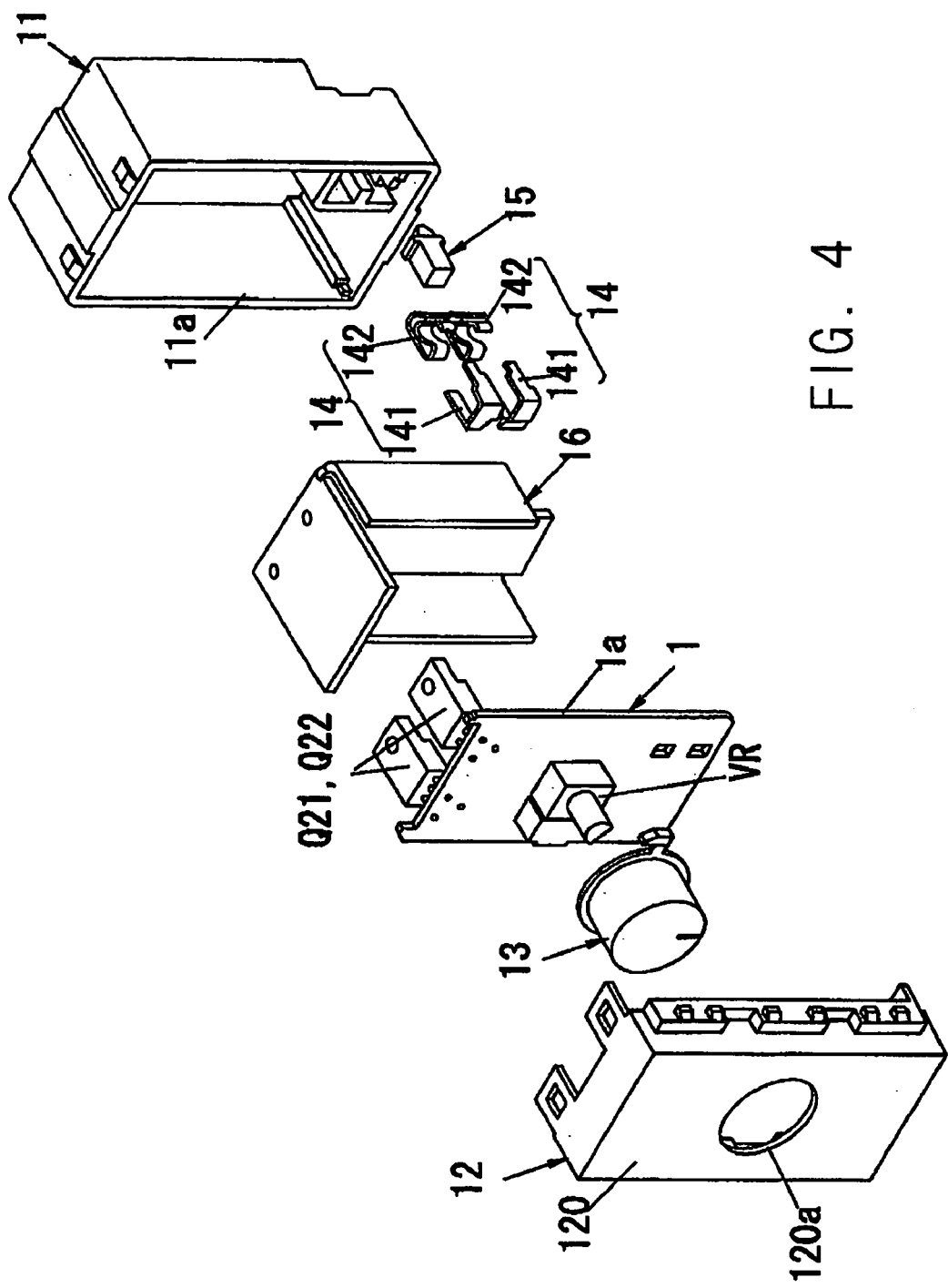
FIG. 4 is an exploded perspective view of an electronic switch having a three-module size.

Furthermore, in the first embodiment, the housing is set to a size corresponding to two wiring mechanisms having one module size. However, the housing is not limited to such a size, but may be set to a size corresponding to three wiring mechanism having one module size, as shown in FIGS. 4 and 5.

Furthermore, a pair of triacs may be used in place of the pair of thyristors S71, S72, and in this construction, it is possible to obtain the same advantages as the first embodiment.

Second Embodiment

Figure 6:
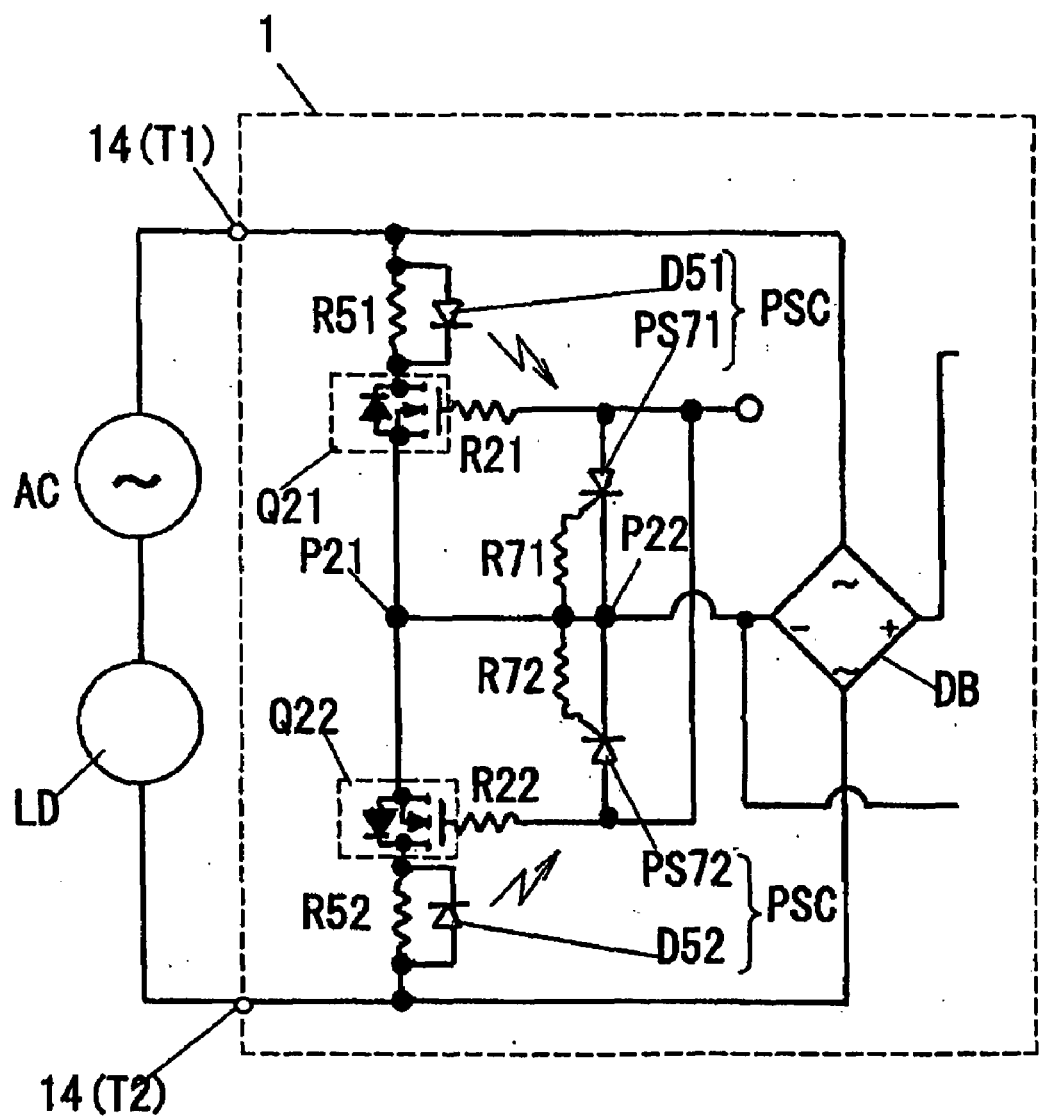
FIG. 6 is a circuit diagram illustrating a part of an electronic switch according to a second embodiment of the present invention.

FIG. 6 is a circuit diagram illustrating a part of an electronic switch according to a second embodiment of the present invention.

The electronic switch according to the second embodiment is different from the first embodiment, as shown in FIG. 6, in that a pair of shunt resistors R51, R52 are provided between a pair of terminal portions 14(T1), 14(T2) and a pair of self arc-suppressing elements Q21, Q22, and in that a pair of photo thyristor couplers PSC, PSC having light emitting diodes D51, D52 and photo thyristors PS71, PS72 are provided.

The light emitting diodes D51, D52 of the photo thyristor couplers PSC, PSC at the AC power source AC side and the load LD side are connected in parallel to the shunt resistors R51, R52 at the AC power source AC side and the load LD side, respectively, such that both anodes of the light emitting diodes faces the pair of terminal portions 14(T1), 14(T2). On the other hand, the pair of photo thyristors PS71, PS72 are connected in inverse-series between the pair of self arc-suppressing elements Q21, Q22 through a pair of resistors R21, R22, such that cathodes of the photo thyristors are connected each other. A connection point P21 between the pair of self arc-suppressing elements Q21, Q22 and a connection point P22 between the pair of photo thyristors PS71, PS72 are connected, and both gates of the pair of photo thyristors PS71, PS72 are connected to both connection points P21, P22 through a pair of resistors R71, R72, respectively.

By driving the pair of light emitting diodes D51, D52 with the voltages across the shunt resistors R51, R52 generated when the overcurrent larger than the predetermined current flows through the pair of shunt resistors R51, R52, respectively, the pair of photo thyristors PS71, PS72 can be instantly turned on.

In the electronic switch having the above construction, when the overcurrent flows through the shunt resistors R51, R52, the voltages across the shunt resistors are increased over the voltages capable of turning on the pair of light emitting diodes D51, D52, the photo thyristors PS71, PS72 are instantly turned on, and the gate voltages of the pair of self arc-suppressing elements Q21, Q22 are extracted, so that the self arc-suppressing elements Q21, Q22 are instantly turned off. As a result, it is possible to instantly release the overcurrent from flowing between the pair of terminal portions 14, 14. Furthermore, since the pair of shunt resistors R51, R52 do not affect the gate voltages of the pair of self arc-suppressing elements Q21, Q22, the fine control thereof is facilitated.

Furthermore, in the second embodiment, a pair of photo thyristor couplers have been used. However, a pair of photo triac couplers having a photo triac and a light emitting diode may be used, and in this construction, it is also possible to obtain the same advantages as the second embodiment.

Third Embodiment

Figure 7:
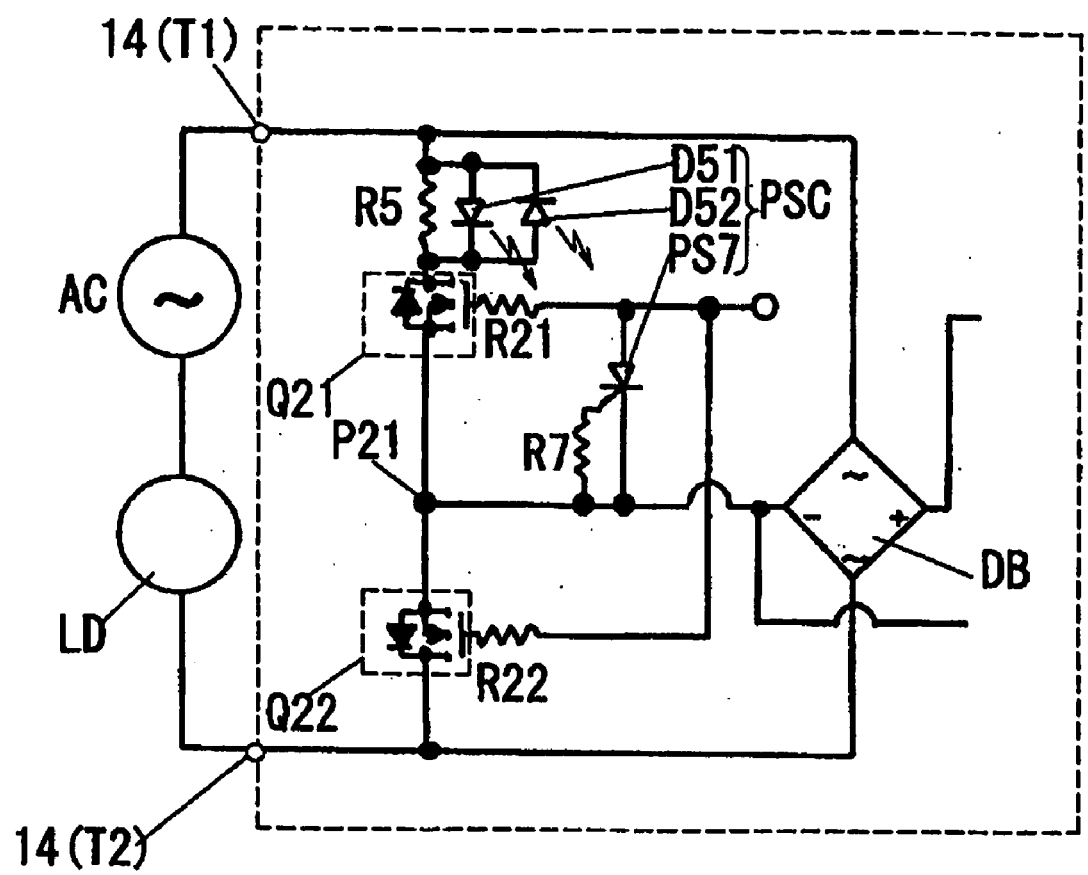
FIG. 7 is a circuit diagram illustrating a part of an electronic switch according to a third embodiment of the present invention.

FIG. 7 is a circuit diagram illustrating a part of an electronic switch according to a third embodiment of the present invention.

The electronic switch according to the third embodiment is different from the first embodiment, as shown in FIG. 7, in that a shunt resistors R5 is provided between a terminal portion 14(T1) and a self arc-suppressing element Q21 at an AC power source AC side, and in that a photo thyristor coupler PSC having a pair of light emitting diodes D51, D52 connected in inverse-parallel and a photo thyristor PS7 is provided.

The pair of light emitting diodes D51, D52 are connected in parallel to the shunt resistor R5. On the other hand, the photo thyristor PS7 is connected between both gates of the pair of self arc-suppressing element Q21, Q22 and a connection point P21 of the pair of self arc-suppressing elements Q21, Q22 through resistors R21, R22, and the gate of the photo thyristor PS7 is connected to the connection point P21 through a resistor R7.

Further, by driving the pair of light emitting diodes D51, D52 with the voltage across the shunt resistor R5 generated when the overcurrent larger than a predetermined current flows through the shunt resistor R5, the photo thyristor PS7 is instantly turned on.

In the electronic switch having the above construction, when the overcurrent flows through the shunt resistor R5, the voltage across the shunt resistor is increased over the voltage capable of turning on the pair of light emitting diodes D51, D52, the photo thyristor PS7 is instantly turned on, and the gate voltages of the pair of self arc-suppressing elements Q21, Q22 are extracted, so that the self arc-suppressing elements Q21, Q22 are instantly turned off. As a result, it is possible to instantly release the overcurrent from flowing between the pair of terminal portions 14, 14. Furthermore, since the shunt resistor R5 does not affect the gate voltages of the pair of self arc-suppressing elements Q21, Q22, the fine control thereof is facilitated. Furthermore, since only one photo thyristor PSC is required, downsizing is possible.

Furthermore, in the third embodiment, the photo thyristor coupler has been used. However, a photo triac coupler having a photo triac and a light emitting diode may be used, and in this construction, it is also possible to obtain the same advantages as the third embodiment.

Fourth Embodiment

Figure 8:
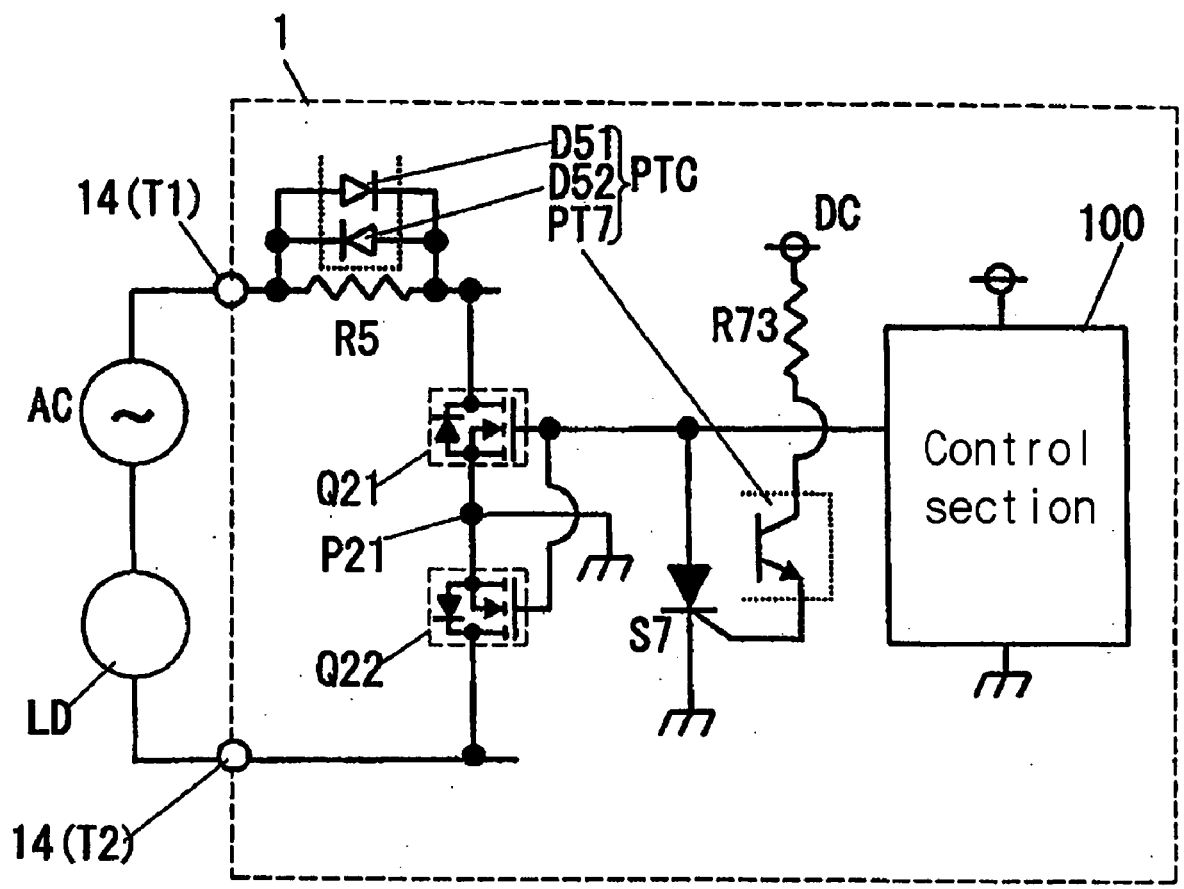
FIG. 8 is a circuit diagram illustrating a part of an electronic switch according to a fourth embodiment of the present invention.
Figure 9:
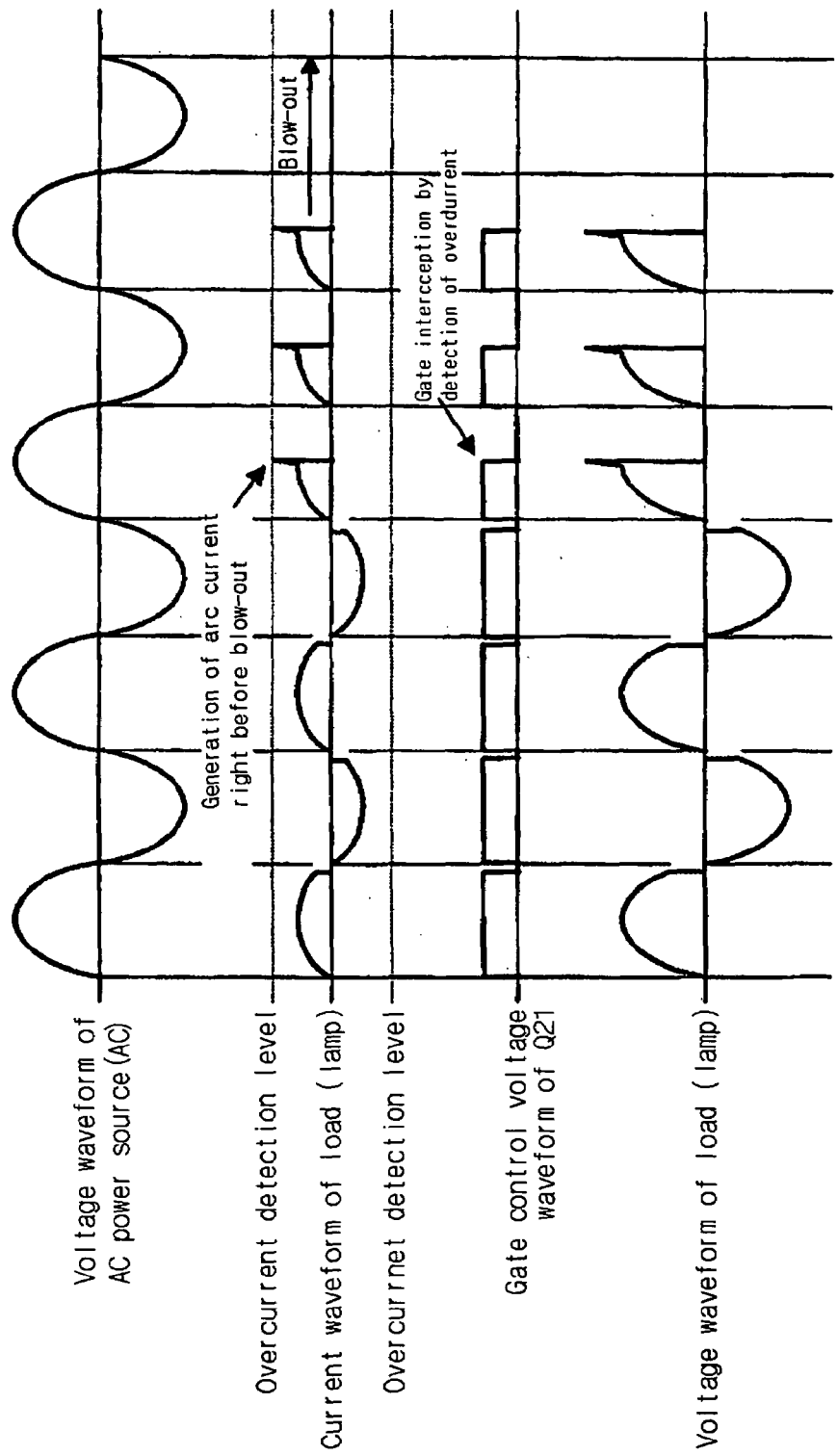
FIG. 9 is an operational waveform diagram of the electronic switch shown in FIG. 8.

FIG. 8 is a circuit diagram illustrating a part of an electronic switch according to a fourth embodiment of the present invention, and FIG. 9 is an operational waveform diagram of the electronic switch shown in FIG. 8.

The electronic switch according to the fourth embodiment is different from the first embodiment, as shown in FIG. 8, in that a shunt resistors R5 and a thyristor S7 are provided between a terminal portion 14(T1) and a self arc-suppressing element Q21 at an AC power source AC side and between both gates of a pair of self arc-suppressing elements Q21, Q22 and a connection point P21 of the pair of self arc-suppressing elements Q21, Q22, respectively, and in that a photo transistor coupler PTC having a pair of light emitting diodes D51, D52 connected in inverse-parallel and a photo transistor PT7 is provided.

The pair of light emitting diodes D51, D52 are connected in parallel to the shunt resistor R5. On the other hand, the photo transistor PT7 is connected between the gate of the thyristor S7 and a DC internal power source (driving source) DC through a resistor R73.

Further, by driving the pair of light emitting diodes D51, D52 with the voltage across the shunt resistor R5 generated when the overcurrent larger than a predetermined current (detection level of FIG. 9) flows through the shunt resistor R5 and thus instantly turning on the photo transistor PT7, the photo thyristor PS7 is instantly turned on. In FIG. 8, a reference numeral 100 denotes phase control (signals) corresponding to a volume resistor VR, and denotes a control section for turning on and off the pair of self arc-suppressing elements Q21, Q22. Furthermore, in FIG. 8, resistors R21, R22 connected to the gates of the self arc-suppressing elements Q21, Q22 are not shown.

In the electronic switch having the above construction, when the overcurrent flows through the shunt resistor R5, the voltage across the shunt resistor is increased over the voltage capable of turning on the pair of light emitting diodes D51, D52, the photo transistor PT7 is instantly turned on, the thyristor S7 is instantly turned on, and the gate voltages of the pair of self arc-suppressing elements Q21, Q22 are extracted, so that the self arc-suppressing elements Q21, Q22 are instantly turned off.

As a result, it is possible to instantly release the overcurrent from flowing between the pair of terminal portions 14, 14, and thus the protection of the electronic switch, the short-circuit protection, and the blow-out protection are possible, as described in the first embodiment (see FIG. 9). Furthermore, since the shunt resistor R5 does not affect the gate voltages of the pair of self arc-suppressing elements Q21, Q22, the fine control thereof is facilitated. Furthermore, since the electronic switch can be constructed using an inexpensive photo transistor coupler PTC and a small-sized thyristor S7, it is possible to reduce cost.

Fifth Embodiment

Figure 10:
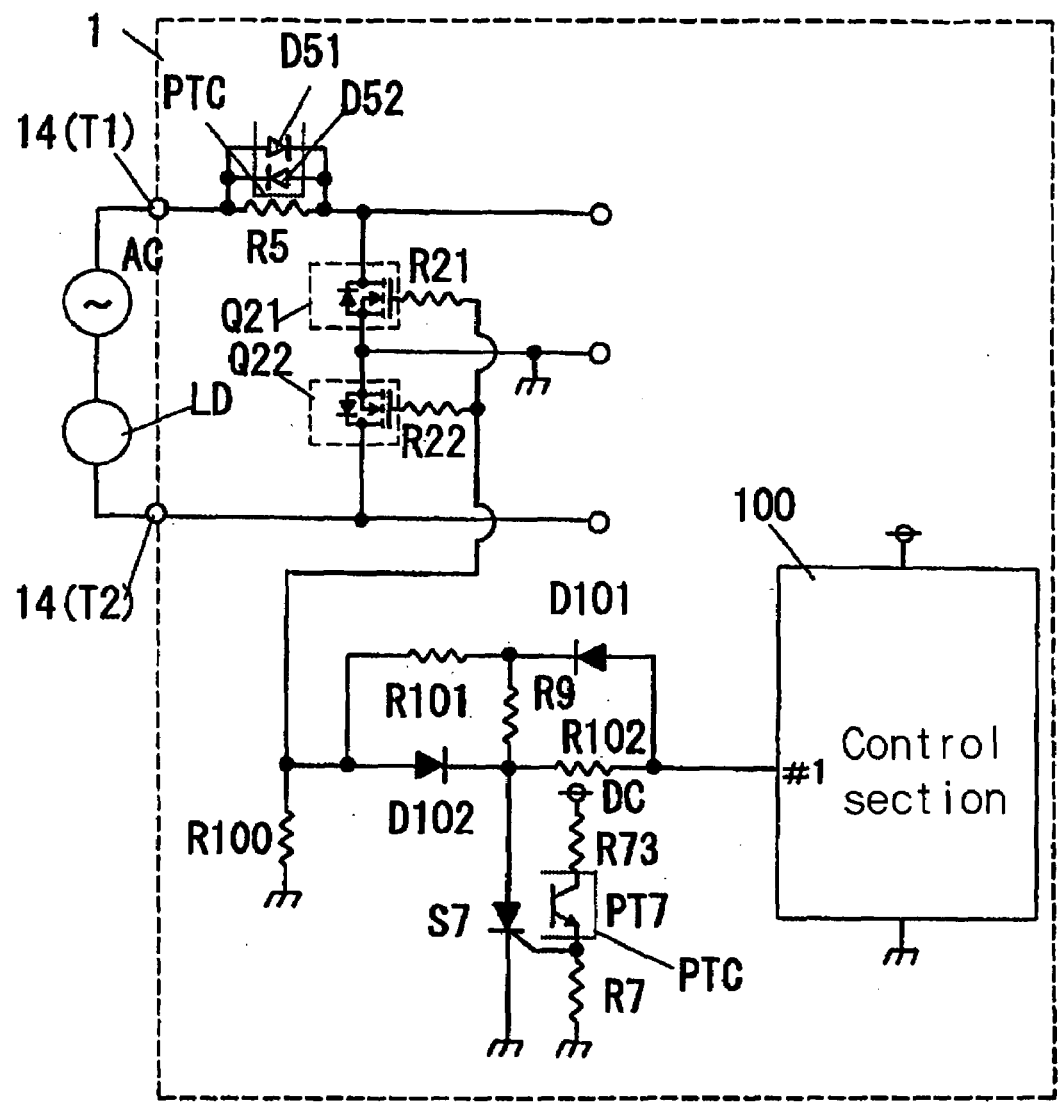
FIG. 10 is a circuit diagram illustrating a part of an electronic switch according to a fifth embodiment of the present invention.

FIG. 10 is a circuit diagram illustrating a part of an electronic switch according to a fifth embodiment of the present invention.

The electronic switch according to the fifth embodiment of the present invention is different from the fourth embodiment, as shown in FIG. 10, in that resistors R100 to R102, R7, R9 and diodes D101, D102 are further provided. Further, among the above resistors, the resistor R100 is set to 220 kΩ, the resistor R101 is set to 100 kΩ, the resistor R102 is set to 15 kΩ, and the resistor R9 is set to 2.7 kΩ.

In such an electronic switch, a noise voltage is generated when the self arc-suppressing elements Q21, Q22 are turned on or turned off, but when the elements are mildly turned on or turned off in order to reduce the noise voltage, there occurs a problem of emitting light due to the switching loss. For this reason, it is necessary to turn on and off the self arc-suppressing elements Q21, Q22 with the optimum mildness capable of reducing the noise voltage and suppressing the heat emitting. Furthermore, in order to instantly release the overcurrent from flowing between the pair of terminal portions 14, 14, the self arc-suppressing elements Q21, Q22 should be turned off instantly.

Accordingly, in the fifth embodiment, in order to reduce the noise voltage and suppress the heat emitting and to instantly turn off the self arc-suppressing elements Q21, Q22, resistors R101, R102 and diodes D101, D102 are provided, and the thyristor S71 is arranged at the self arc-suppressing elements Q21, Q2 side rather than the resistor R102 side.

When the control section 100 outputs an on voltage of a high level from a port #1, the on voltage is applied to both gates of the self arc-suppressing elements Q21, Q22 through the diode D101 and the resistors R101, R21, R22, electric charges are charged to both gates of the self arc-suppressing elements Q21, Q22 with the mildness corresponding to a resistance value of the resistor R101, and thus the self arc-suppressing elements Q21, Q22 are turned on. On the other hand, when the control section 100 outputs an on voltage of a low level (for example, a ground level) from a port #1, the electric charges are discharged from the gates of the self arc-suppressing elements Q21, Q22 through the resistors R21, R22, the diode D102 and the resistor R102 with the mildness corresponding to a resistance value of the resistor R102, and thus the self arc-suppressing elements Q21, Q22 are turned off. As a result, it is possible to reduce the noise voltage and suppress the heat emitting.

On the other hand, when the aforementioned overcurrent flows through the shunt resistor R5, the photo transistor PT7 is instantly turned on and the thyristor S7 is instantly turned on, so that the gate voltages of the self arc-suppressing elements Q21, Q22 are instantly extracted through the resistors R21, R22 and the diode D102. As a result, it is possible to instantly turn off the self arc-suppressing elements Q21, Q22.

Furthermore, in the fifth embodiment, a resistor R9 is provided so that the on state of the thyristor S7 is held and the off state of the self arc-suppressing elements Q21, Q22 is held for at least a half period of the AC power source (commercial power source) AC after the thyristor S7 has been acted in an overcurrent mode. That is, when the resistance value of the resistor R102 set for reducing the noise voltage becomes larger, the current flowing through the thyristor S7 becomes smaller. For this reason, the resistor R9 is connected to the thyristor S7 through the diode D101, and the resistance value of the resistor R9 is set to a value with which the holding current of the thyristor S7 can be secured.

According to the fifth embodiment having the above construction, the switching speed of turning on and off the self arc-suppressing elements, the stopping timing of the self arc-suppressing elements when the overcurrent has been detected, and the holding current of the thyristor can be controlled independently with the minimum number of components.

Sixth Embodiment

Figure 11:
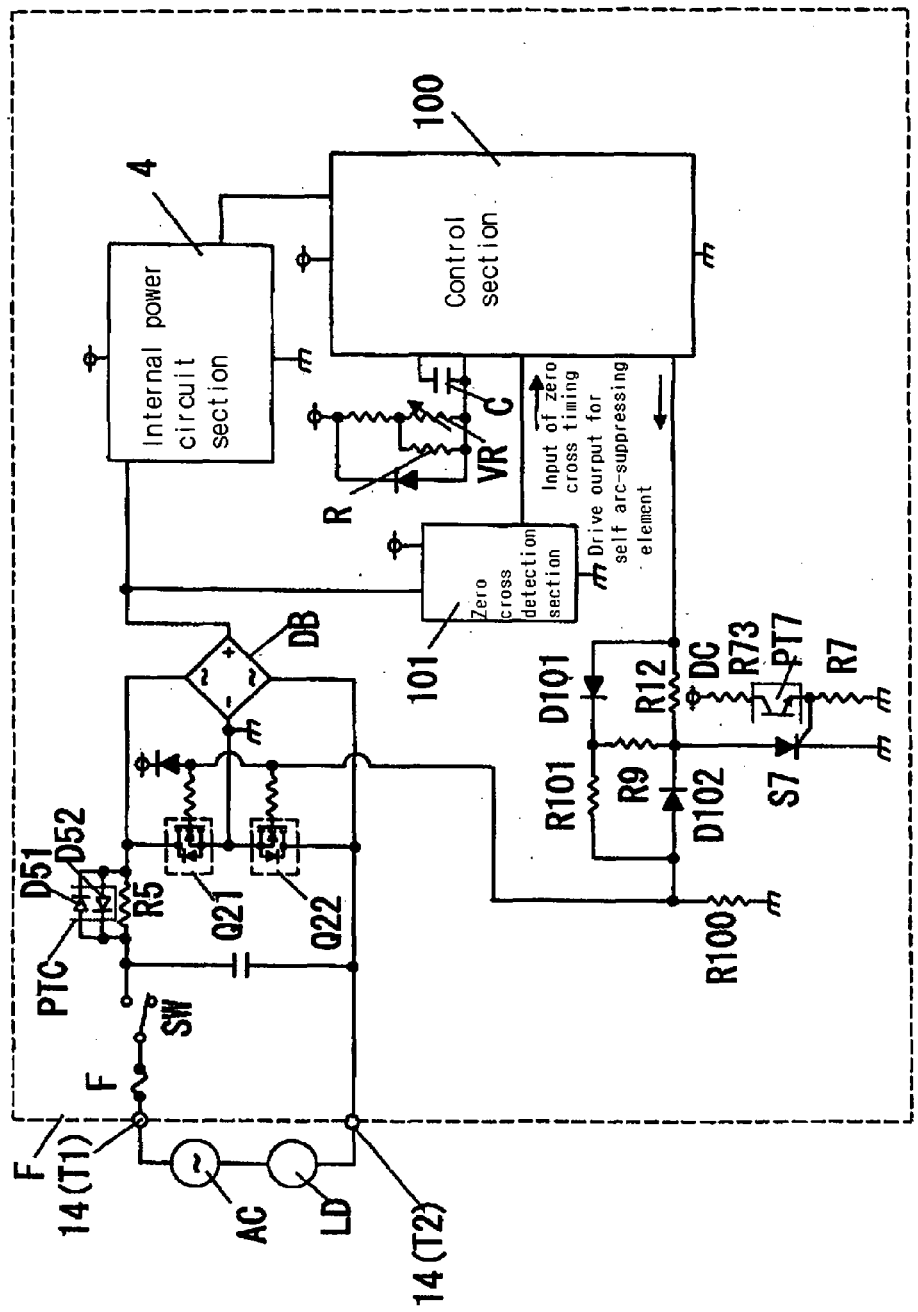
FIG. 11 is a circuit diagram illustrating an electronic switch according to a sixth embodiment of the present invention.

FIG. 11 is a circuit diagram illustrating an electronic switch according to a sixth embodiment of the present invention, and FIG. 12 is an explanatory diagram illustrating decrease in deviation of volume resistance in the electronic switch shown in FIG. 11.

The electronic switch according to the sixth embodiment is different from the fifth embodiment, as shown in FIG. 11, in that a fixed resistor R connected in parallel to the volume resistor VR for adjusting a phase angle in the aforementioned phase control is further provided.

Since the volume resistors coming into the market generally have a resistance value of large deviation ranging from ±20% to ±30%, the adjustable phase angle is deviated largely for each electronic switch. For this reason, it has been designed that the resistance values of the volume resistors are selected or a half-fixed volume resistor for adjustment is attached during production, but it causes increase in cost.

Therefore, in the sixth embodiment, the fixed resistor R is connected in parallel to the volume resistor VR, and the deviation of the adjustable phase angle is suppressed with the synthesized resistance value. The fixed resistor can suppress the synthesized resistance value within a deviation of about 100 kΩ+36% to 100 kΩ-19.4%, by connecting the fixed resistor R having, for example, a deviation of about 200 kΩ±5% in parallel, as shown in FIG. 12B, even when the volume resistor VR shown in FIG. 12A has, for example, a deviation of about 100 kΩ±30%, so that the resistance value generally has a deviation range of ±2 to ±5%.

Additionally explaining the electronic switch shown in FIG. 11, the pair of self arc-suppressing elements Q21, Q22 are normally turned off. An internal power circuit section (power source section) 4 for driving the control section 100 is provided through the diode bridge DB to both ends of the pair of self arc-suppressing elements Q21, Q22. A zero cross detection section 101 for outputting a zero cross timing signal to the control section 100 in the vicinity of 0V in an output waveform rectified by the diode bridge DB is provided. Further, the control section 100 outputs signals for turning on the self arc-suppressing elements Q21, Q22 at the timing, and outputs signals for turning off the self arc-suppressing elements Q21, Q22 after a constant time (time smaller than a half period) elapses when the timing is determined with the volume resistor VR and the capacitor C.

Furthermore, when the overcurrent flows due to the short-circuit of the load LD and the voltage across the shunt resistor R5 becomes larger than 1 to 1.5V, current flows through the light emitting diodes D51, D52, and thus the photo transistor PT7 is turned on. Furthermore, in FIG. 11, and SW denotes a switch, F denotes a fuse, which are included in the electronic switch according to this embodiment.

Seventh Embodiment

FIG. 13 is a circuit diagram illustrating an electronic switch according to a seventh embodiment of the present invention.

The electronic switch according to the seventh embodiment, as shown in FIG. 13, comprises a control section 100, a drive circuit section 102, where a pair of terminal portions 14, 14, and the aforementioned pair of self arc-suppressing elements Q21, Q22 are connected in inverse-series between the pair of terminal portions 14(T1), 14(T2), so that the control section 100 turns on and off the pair of self arc-suppressing elements Q21, Q22 by means of phase control (signals) through the drive circuit section 102.

More specifically, between the terminal portion 14(T1) and the self arc-suppressing element Q21 at the AC power source AC side, a shunt resistor R5 is provided, and a photo transistor coupler PTC having a pair of light emitting diodes D51, D52 connected in inverse-parallel each other and a photo transistor PT7 is also provided. The pair of light emitting diodes D51, D52 are connected in parallel to the shunt resistor R5. On the other hand, in the photo transistor PT7, the collector is connected to a driving power source DC through a resistor R73 and also connected to one input port of the control section 100, and the emitter is connected to a ground.

Further, the control section 100 instantly stops the control of turning on and off the pair of self arc-suppressing elements Q21, Q22 in accordance with the voltage across the shunt resistor R5 generated when the overcurrent larger than a predetermined current flows through the shunt resistor R5.

In the electronic switch having the above construction, when the overcurrent flows through the shunt resistor R5, the control section 100 instantly stops the control of turning on and off the pair of self arc-suppressing elements Q21, Q22 by means of change of the voltage level applied to the input port from high to low. As a result, it is possible to instantly release the overcurrent from flowing between the pair of terminal portions 14, 14. Furthermore, when the control section 100 comprises a microcomputer or a CMOS-IC (the microcomputer in FIG. 13), reduction in cost and downsizing are possible.

Eighth Embodiment

Figure 14:
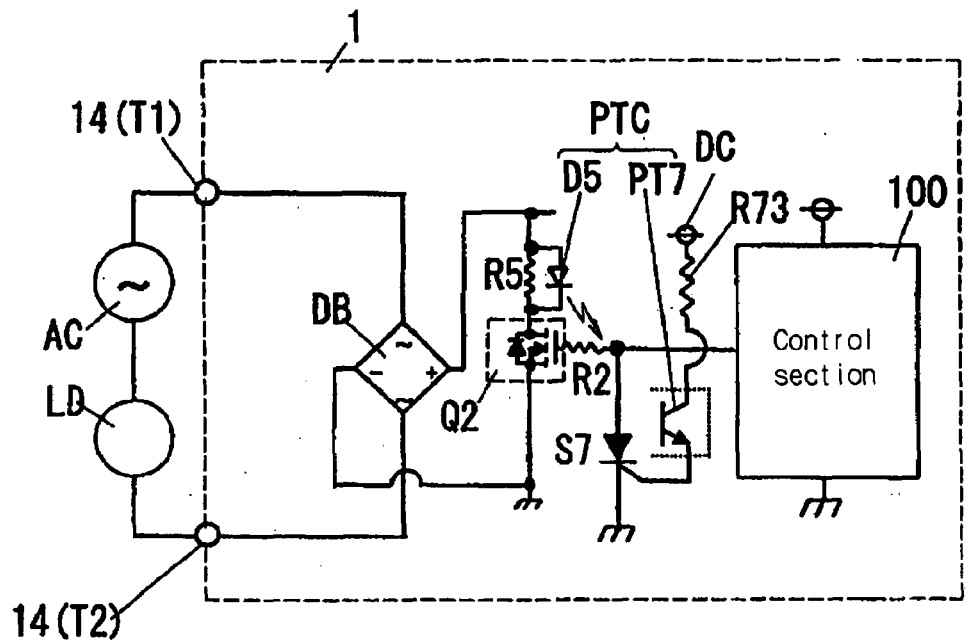
FIG. 14 is a circuit diagram illustrating an electronic switch according to an eighth embodiment of the present invention.

FIG. 14 is a circuit diagram illustrating an electronic switch according to an eighth embodiment of the present invention.

The electronic switch according to the eighth embodiment, as shown in FIG. 14, comprises one self arc-suppressing element Q2 described above, in addition to a control section 100 and a pair of terminal portions 14(T1), 14T(2), where the control section 100 turns on and off the self arc-suppressing element Q2 by means of phase control (signals).

More specifically, a diode bridge DB of which an AC input terminal is connected to the pair of terminal portions 14(T1), 14(T2), a shunt resistor R5, a thyristor S7, and a photo transistor coupler PTC having a light emitting diode D5 and a photo transistor PT7 are provided.

In order that the self arc-suppressing element Q2 intercepts between the diode bridge DB and a DC output terminal in the turning-off thereof, the drain and the source of the MOS FET constituting the self arc-suppressing element Q2 are connected to positive and negative output terminals of the diode bridge DB, respectively. The shunt resistor R5 is provided between the positive output terminal of the diode bridge DB and the self arc-suppressing element Q2. The thyristor S7 is connected between the gate and the source of the self arc-suppressing element Q2 through a resistor R2. The light emitting diode D5 is connected in parallel to the shunt resistor R5. The collector of the photo transistor PT7 is connected to an internal power source DC through a resistor R73, and the emitter is connected to the gate of the thyristor S7.

Further, by driving the light emitting diode D5 with the voltage across the shunt resistor R5 generated when the overcurrent larger than predetermined current flows through the shunt resistor R5 and thus instantly turning on the photo transistor PT7, the thyristor S7 is instantly turned on.

In the electronic switch having the above construction, when the overcurrent flows through the shunt resistor R5, the voltage across the shunt resistor is increased over the voltage capable of turning on the light emitting diodes D5, the photo transistor PT7 is instantly turned on, the thyristor S7 is instantly turned on, and the gate voltages of the self arc-suppressing element Q2 is thus extracted, so that the self arc-suppressing element Q21 is instantly turned off.

As a result, it is possible to instantly release the overcurrent from flowing between the pair of terminal portions 14, 14. Furthermore, since only one self arc-suppressing element Q2 and one shunt resistor R5 are required, the reduction in cost and the downsizing are possible.

Ninth Embodiment

Figure 15:
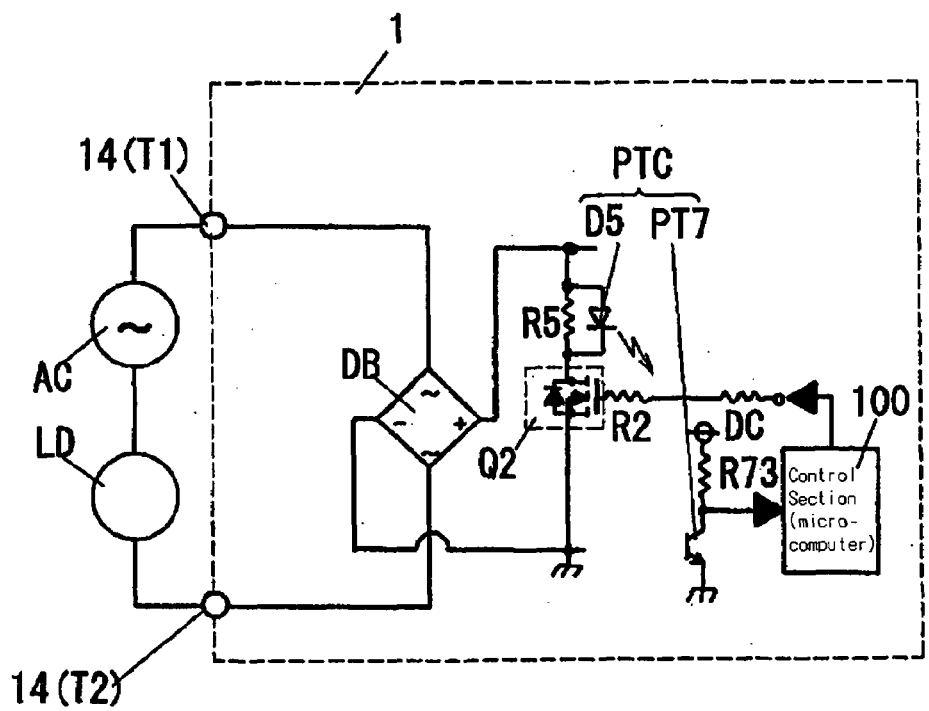
FIG. 15 is a circuit diagram illustrating an electronic switch according to a ninth embodiment of the present invention.

FIG. 15 is a circuit diagram illustrating an electronic switch according to a ninth embodiment of the present invention.

The electronic switch according to the ninth embodiment is different from the eighth embodiment, as shown in FIG. 15, in that the thyristor S7 is omitted and a control section 100 instantly releases the overcurrent from flowing between a pair of terminal portions 14, 14, similarly to the seventh embodiment.

That is, the collector of the photo transistor PT7 is connected to an internal power source DC through a resistor R73 and also to one input port of the control section 100, and the emitter is connected to the ground. The control section 100 instantly stops the control of turning on and off the self arc-suppressing element Q2 in accordance with the voltage across the shunt resistor R5 generated when the overcurrent larger than predetermined current flows through the shunt resistor R5.

In the electronic switch having the above construction, when the overcurrent flows through the shunt resistor R5, the control section 100 instantly stops the control of turning on and off the self arc-suppressing element Q2 with change of the voltage level applied to the input port from high to low, so that it is possible to instantly release the overcurrent from flowing between the pair of terminal portions 14, 14.

Tenth Embodiment

Figure 16:
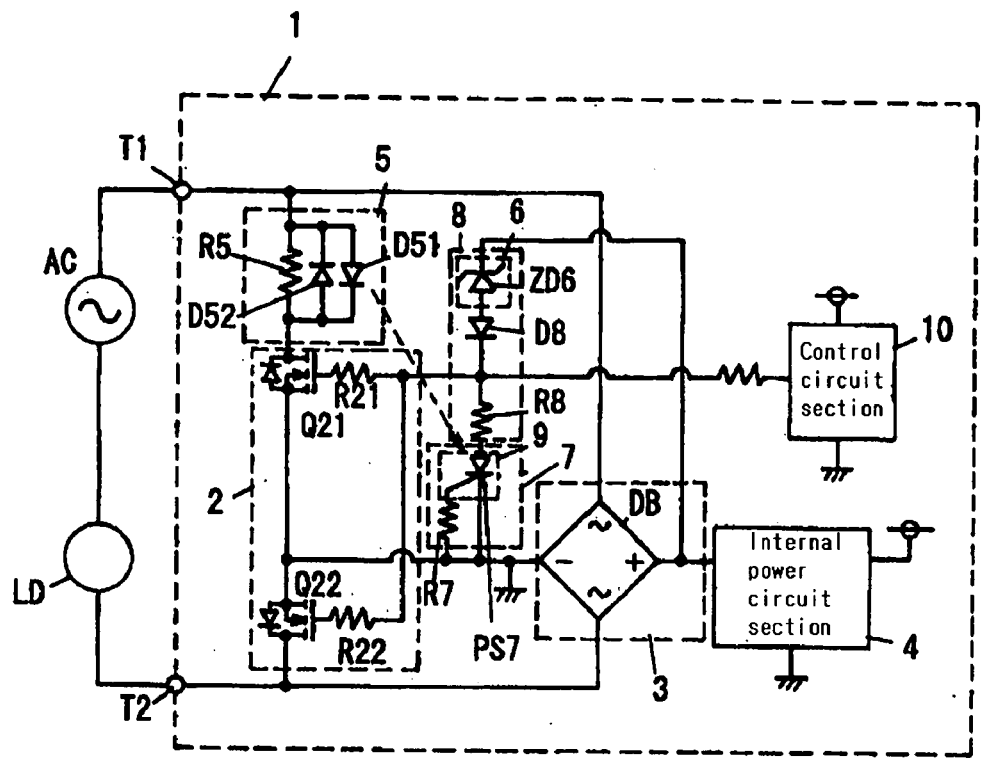
FIG. 16 is a circuit diagram illustrating an electronic switch according to a tenth embodiment of the present invention.
Figure 17:
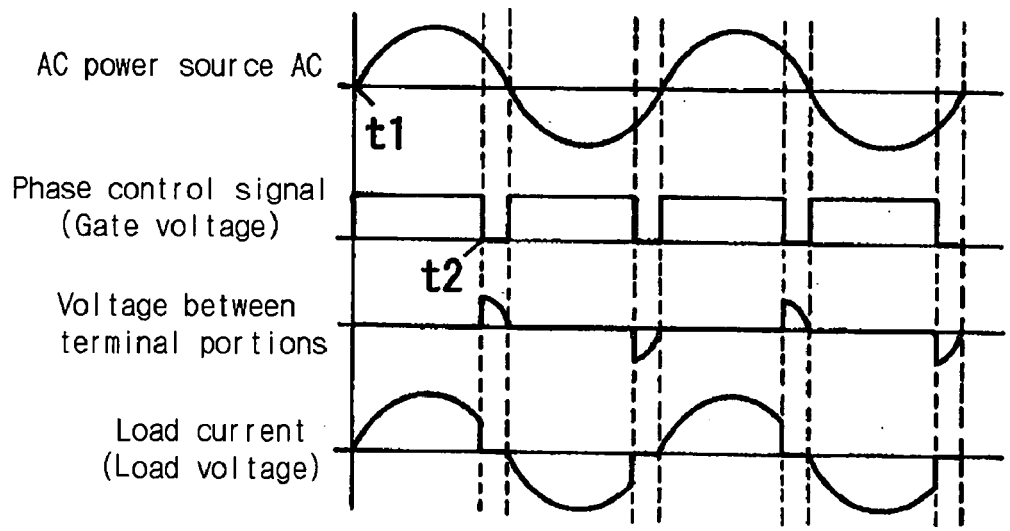
FIG. 17 is an operational waveform diagram of the electronic switch shown in FIG. 16 in a normal mode.
Figure 18:
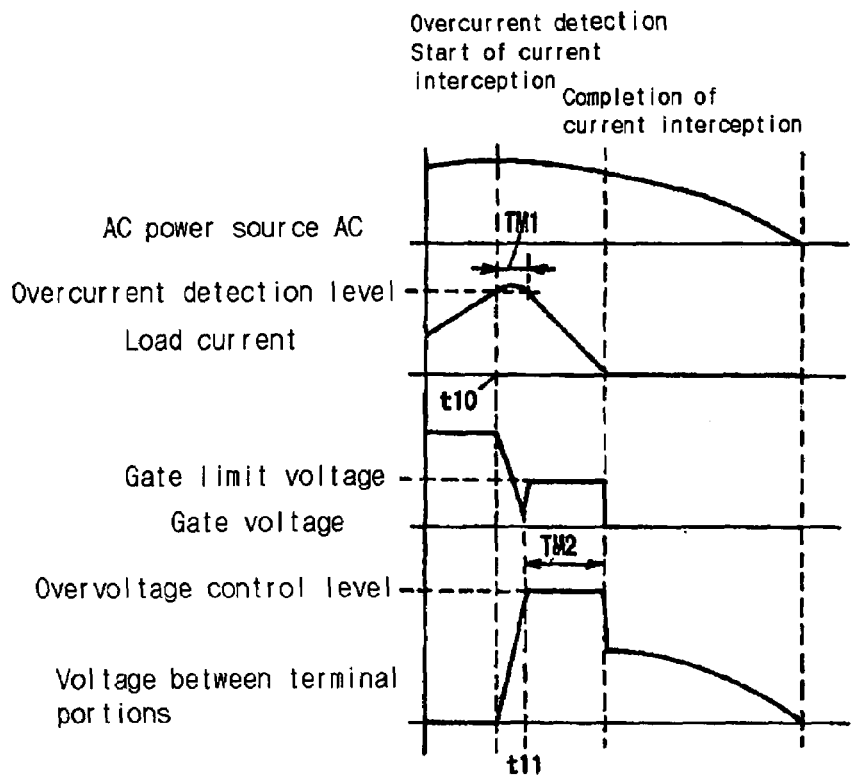
FIG. 18 is an operational waveform diagram of the electronic switch shown in FIG. 16 in an overcurrent mode.

FIG. 16 is a circuit diagram illustrating an electronic switch according to a tenth embodiment of the present invention, FIG. 17 is an operational waveform diagram of the electronic switch shown in FIG. 16 in a normal mode, and FIG. 18 is an operational waveform diagram of the electronic switch shown in FIG. 16 in an overcurrent mode.

Here, for example, the electronic switch according to the third embodiment of the aforementioned embodiments, as shown in FIG. 7, comprises an overcurrent detection circuit section and an overcurrent protection circuit section, in addition to a switch circuit section comprising the self arc-suppressing (switching) elements Q21, Q22 and the resistors R21, R22, a rectifier circuit section comprising the diode bridge (rectifier) DB, an internal power circuit section (not shown in FIG. 7) for supplying the internal power to various sections, and a control circuit section (not shown in FIG. 7) for turning on and off the self arc-suppressing elements Q21, Q22 with the phase control signals.

The overcurrent detection circuit section detects whether the current flowing between the terminal portions T1, T2 reaches an overcurrent detection level larger than a predetermined rating current and smaller than the withstand current of the self arc-suppressing elements Q21, Q22, and comprises a resistor (shunt resistor) R5 and light emitting diodes D51, D52.

The overcurrent protection circuit section extracts the phase control signals to both control terminals of the self arc-suppressing elements Q21, Q22, when the overcurrent detection circuit section detects that the overcurrent detection level has been reached, and comprises a photo thyristor PS7 and a resistor R7.

In the electronic switch having the above construction, when the overcurrent having the overcurrent detection level flows between the terminal portions T1, T2, the light emitting diodes emit light, the photo thyristor PS7 is turned on, and the self arc-suppressing elements Q21, Q22 are turned off, so that the overcurrent does not flow between the terminal portions T1, T2.

However, in the construction of intercepting the connection between the terminal portions T1, T2 with the overcurrent, there is a problem that an overvoltage is generated between the terminal portions T1, T2 due to a counter electromotive force resulting from the AC power source AC and inductance of the wiring cable thereto.

This problem can be solved by providing a surge absorber between the terminal portions T1, T2, but the cost and the size thereof are increased and self arc-suppressing elements having a higher withstand voltage should be used. That is, when the AC power source AC of 200V or more is used, the surge absorber of which the restriction voltage at 1 mA has a 470V class is necessarily used not to enable the electrical connection with the normal voltage, but in this surge absorber, the restriction voltage with the current of several A excesses 600V and thus general-purpose self arc-suppressing elements having a withstand voltage of 600V or less cannot be used. Furthermore, since the use of self arc-suppressing elements having a higher withstand voltage causes increase in the turn-on voltage and the light emitting, the load capacity should be restricted or an area for sinking heat should be enlarged.

The electronic switch according to the tenth embodiment prevents large stress from being applied to a pair of self arc-suppressing elements due to the counter electromotive force resulting from the AC power source and the inductance of the wiring cable thereto in an overcurrent protection mode.

That is, the electronic switch according to the tenth embodiment, as shown in FIG. 16, is provided between the AC power source AC and the load LD such as an illuminating mechanism or a ventilation fan, and adjusts the power supply to the load LD from the AC power source AC by means of the phase control, where the electronic switch comprises a switch circuit section 2, a rectifier circuit section 3, an internal power circuit section 4, an overcurrent detection circuit section 5, an overvoltage detection circuit 6, an overcurrent protection circuit section 7, an overvoltage protection circuit section 8, an off holding circuit section 9, and a control circuit section 10 are provided in the circuit block 1.

The switch circuit section 2 comprises a pair of self arc-suppressing elements Q21, Q22 connected in series between the pair of terminal portions T1, T2 to which the AC power AC is applied through the load LD, and a pair of resistors R21, R22 connected in series to the respective control terminals (gates) thereof. Each of the self arc-suppressing elements Q21, Q22 comprise an MOS FET having a parasitic diode connected in inverse-parallel, and in the tenth embodiment, the sources of the MOS FETs are connected in inverse-series each other. Further, the self arc-suppressing element according to the present invention is not limited to the MOS FET, but may comprise a bipolar transistor and a diode connected in inverse-parallel thereto, or may comprise an IGBT and a diode connected in inverse-parallel thereto.

The rectifier circuit section 3 comprises a diode bridge (rectifier) DB of which both AC input terminals are connected to the pair of terminal portions T1, T2 and of which a negative DC output terminal is connected between the pair of self arc-suppressing elements Q21, Q22 (a connection point in the figure).

The internal power circuit section 4 smoothes the DC power from the rectifier circuit section 3 and generates an internal power of a predetermined level, and supplies the internal power to the respective sections (the control circuit section 10, etc.) of the electronic switch.

The overcurrent detection circuit section 5 detects whether the current flowing between the pair of terminal portions T1, T2 reaches the overcurrent detection level larger than a predetermined rating current and smaller than the withstand current of the pair of self arc-suppressing elements Q21, Q22. In the figure, the overcurrent detection circuit section comprises a resistor (a shunt resistor) R5 as a current-voltage converter that is provided between the terminal portion T1 and the self arc-suppressing element Q21 and converts the current flowing between the pair of terminal portions T1, T2 into a voltage, the pair of light emitting diodes D51, D52 that are connected in parallel to the resistor R5, connected in inverse-parallel each other, and emit light when the voltage across the resistor R5 reaches the voltage corresponding to the overcurrent detection level.

The overvoltage detection circuit section 6 detects whether the voltage applied to the pair of terminal portions T1, T2 reaches the overvoltage detection level larger than at least the AC source voltage AC. In the tenth embodiment, the overvoltage detection circuit section comprises a Zener diode ZD6 of which the cathode and the anode are connected to the positive DC output terminal of the diode bridge DB and both control terminal side (a connection point of the resistors R21, R22 in the figure) of the pair of self arc-suppressing elements Q21, Q22, respectively.

The overcurrent protection circuit section 7 extracts the phase control signals to both control terminals of the pair of self arc-suppressing elements Q21, Q22, when the overcurrent detection circuit section 5 detects that the overcurrent detection level has been reached. In the figure, the overcurrent protection circuit section comprises the photo thyristor PS7 of which the cathode and the gate are connected to the connection point of the pair of self arc-suppressing elements Q21, Q22 and both control terminals of the pair of self arc-suppressing elements Q21, Q22, respectively, and which is turned on through the light emitting of the light emitting diode of the overcurrent detection circuit section 5, and the resistor R7 provided between the gate and the connection point of the pair of self arc-suppressing elements Q21, Q22.

Here, the photo thyristor PS7 of the overcurrent protection circuit section 7 according to the tenth embodiment is used in common with the off holding circuit section 9 for holding the off state of the pair of self arc-suppressing elements Q21, Q22, for a time period from a timing when the overvoltage detection circuit section 6 detects that the overvoltage detection level has been reached to a timing when the phase control signal is changed to a low level signal for turning off the pair of self arc-suppressing elements Q21, Q22. The photo thyristor PS7 and the light emitting diodes D51, D52 of the overcurrent detection circuit section 5 constitute the photo thyristor coupler.

When the overvoltage detection circuit section 6 detects that the overvoltage detection level has been reached, the overvoltage protection circuit section 8 outputs a signal for suppressing the voltage between the pair of terminal portions T1, T2 to the overvoltage restriction level larger than the AC source voltage AC and smaller than the withstand voltage of the pair of self arc-suppressing elements Q21, Q22, to both control terminals of the pair of self arc-suppressing elements Q21, Q22, unlike the phase control signal. In the figure, the overvoltage protection circuit section comprises the Zener diode ZD6, a diode D8, and a resistor R8, and uses the Zener diode ZD6 in common with the overvoltage detection circuit section 6. The overvoltage detection level and the overvoltage restriction level are the same, and the Zener diode ZD6 is set to a Zener voltage corresponding to both levels. The diode D8 prevents the phase control signal from flowing in the overvoltage detection circuit section 6. The resistor R8 prevents both control terminals of the pair of self arc-suppressing elements Q21, Q22 from being grounded to allow the overvoltage protection circuit section 8 to work.

The control circuit section 10 turns on and off the pair of self arc-suppressing elements Q21, Q22, by outputting the phase control signal, corresponding to the calling angle in accordance with manipulation of a manipulation section not shown, to both control terminals of the pair of self arc-suppressing elements Q21, Q22.

Next, actions of the electronic switch according to the tenth embodiment in the normal mode will be described. As shown in FIG. 17, the phase control signal output from the control circuit section 10 becomes a high level at the zero cross timing t1 of the AC power source AC, and thus the pair of self arc-suppressing elements Q21, Q22 are turned on. As a result, load current flows between the pair of terminal portions T1, T2 due to the AC power source AC. At that time, the voltage between the terminal portions T1, T2 becomes almost zero. Thereafter, at the timing t2 corresponding to the end of the calling angle due to the manipulation, the control signal output from the control circuit section 10 becomes a low level, and the pair of self arc-suppressing elements Q21, Q22 are turned off. As a result, the electrical connection between the pair of terminal portions T1, T2 is intercepted, and the load current does not almost flow. At that time, the AC voltage AC is applied between the terminal portions T1, T2, and thus the internal power circuit section 4 works. These series of actions are repeated every half wave of the AC power voltage AC in accordance with the phase control signal.

Next, actions of the electronic switch according to the tenth embodiment in the overcurrent mode will be described. When the inrush current is generated or when the short-circuit or the blow-out of the load is generated, as shown in FIG. 18, when the overcurrent (load current) reaching the overcurrent detection level is generated and the current flowing between the terminal portions T1, T2 reaches the overcurrent detection level (t10), the light emitting diodes of the overcurrent detection circuit section 5 are lighted for an overcurrent detection time period TM1 when the overcurrent detection level is being reached, so that the photo thyristor PS7 is turned on.

When the photo thyristor PS7 is turned on, the phase control signal to both control terminals (gates) of the self arc-suppressing elements Q21, Q22 is extracted, and the voltages of the respective control terminals (gate voltages) start dropping. With the dropping of the gate voltages, the on resistance of the respective self arc-suppressing elements is increased, and thus the voltage between the terminal portions T1, T2 is increased. Thereafter, when the overcurrent (load current) is changed from rising to dropping, the voltage between the terminal portions T1, T2 is increased over the AC voltage AC due to the counter electromotive force resulting from the AC power source AC and the inductance of the wiring cable thereto. As a result, when the voltage between the terminal portions T1, T2 reaches the overvoltage detection level (overvoltage restriction level) (t11), the Zener diode ZD6 repeats the turning-on and the turning-off for the overvoltage detection time period TM2 when reaching the overvoltage detection level.

That is, when the overvoltage restriction level is reached and the Zener diode ZD6 is turned on, the positive DC output terminal of the diode bridge bB is connected to the control terminal side of the self arc-suppressing elements Q21, Q22, and when the gate limit voltages of the self arc-suppressing elements are reached with the voltage rising of the positive DC output terminal, the respective self arc-suppressing elements are turned on. As a result, when the voltage across the diode bridge DB is changed from the rising to the dropping and the voltage of the positive DC output terminal is smaller than the overvoltage restriction level, the Zener diode ZD6 is turned off, but the voltage of the positive DC output terminal is changed to the rising again due to the overvoltage. When the overvoltage restriction level is reached and the Zener diode ZD6 is turned on, the gate voltage start the rising, and reaches the gate limit voltages of the self arc-suppressing elements, so that the respective self arc-suppressing elements are turned on. Since these actions are repeated for the overvoltage detection time period TM2 when the overvoltage (the voltage between the terminal portions T1, T2) reaches the overvoltage detection level, the voltage between the terminal portions T1, T2 are suppressed to the overvoltage restriction level. When the overcurrent is intercepted completely and the overvoltage detection time period TM2 is finished, the voltage between the terminal portions T1, T2 is stably fixed to the voltage level of the AC power source AC.

Furthermore, when the overcurrent becomes smaller than the overcurrent detection level in the course of decrease in the overcurrent, the light emitting diodes of the overcurrent detection circuit portion 5 is put out, but the photo thyristor PS7 holds its on state in the course of receiving the phase control signal of a high level for the turn-on from the control circuit section 10. The photo thyristor PS7 is turned off at the timing when the phase control signal is changed to a low level for the turn-off.

The above actions are executed every time the overcurrent reaching the overcurrent detection level is generated. For example, when the load LD is a glow lamp, the inrush current in starting is restricted every half wave, and the above actions are repeated until the filament is heated and the overcurrent detection level is not reached. When the load LD is short-circuited, the above actions are repeated until the short-circuit state is released. When the load is blow out, the above actions are repeated until the filament or the fuse of a light bulb is cut off.

As described above, according to the tenth embodiment, when it is detected that the overcurrent detection level has been reached, the phase control signal to both control terminals of the pair of self arc-suppressing elements Q21, Q22 is extracted, so that the voltage between the pair of terminal portions T1, T2 is raised over the voltage of the AC power source AC by means of the counter electromotive force due to the AC power source AC and the inductance of the wiring cable thereto. However, when it is detected that the voltage between the pair of terminal portions T1, T2 reaches the overvoltage detection level (the overvoltage restriction level), the voltage between the pair of terminal portions T1, T2 is suppressed to the overvoltage restriction level by the overvoltage protection circuit section 8, so that it is possible to prevent a large stress from being applied to the pair of self arc-suppressing elements Q21, Q22 due to the counter electromotive force resulting from the AC power source AC and the inductance of the wiring cable thereto in an overcurrent protection mode.

Further, after the timing when it is not detected that the overcurrent detection level is reached, since it is possible to prevent the pair of self arc-suppressing elements Q21, Q22 from being turned on at a timing different from the timing of the original phase control with the phase control signal, it is possible to prevent the pair of self arc-suppressing elements Q21, Q22 from being turned on at the timings other than the zero cross timing of the AC power source AC.

Furthermore, by using a characteristic of the photo thyristor PS7, it is possible to simply construct the overcurrent protection circuit section 7 and the off holding circuit section 9, and thus the downsizing thereof is possible. Furthermore, the surge absorber is not necessary.

Eleventh Embodiment

Figure 19:
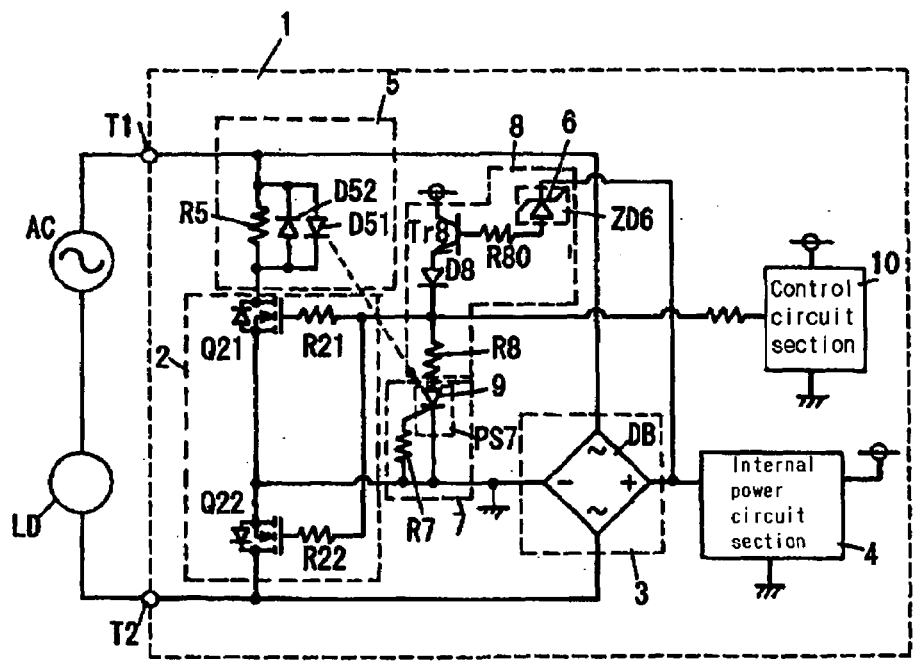
FIG. 19 is a circuit diagram illustrating an electronic switch according to an eleventh embodiment of the present invention.

FIG. 19 is a circuit diagram illustrating an electronic switch according to an eleventh embodiment of the present invention.

The electronic switch according to the eleventh embodiment is different from the tenth embodiment, as shown in FIG. 19, in that the overvoltage protection circuit section 8 comprises a transistor Tr8 which is provided between the diode D8 and the Zener diode ZD6, of which the collector receives the internal power, and of which the emitter and the base are connected to the anode of the diode D8 and the anode of the Zener diode ZD6, and a resistor R80 provided between the base and the anode of the Zener diode ZD6. That is, the electronic switch according to the eleventh embodiment is constructed such that the current flowing through the Zener diode ZD6 is amplified by the transistor Tr8.

In the tenth embodiment, the Zener diode ZD6 should have a high withstand voltage. In addition, since the current flowing toward a high voltage causes a large loss, a large-sized power Zener diode is required.

On the contrary, in the eleventh embodiment, since the power Zener diode having a high withstand voltage and a large size is not necessary by providing the transistor Tr8 and a Zener diode having a small signal level can be used, the reduction in cost and the downsizing are possible. In addition, a signal for suppressing the voltage to the overvoltage restriction level can be output at a high speed to both control terminals of the self arc-suppressing elements Q21, Q22, and the self arc-suppressing elements Q21, Q22 can be protected from the overvoltage.

Twelfth Embodiment

Figure 20:
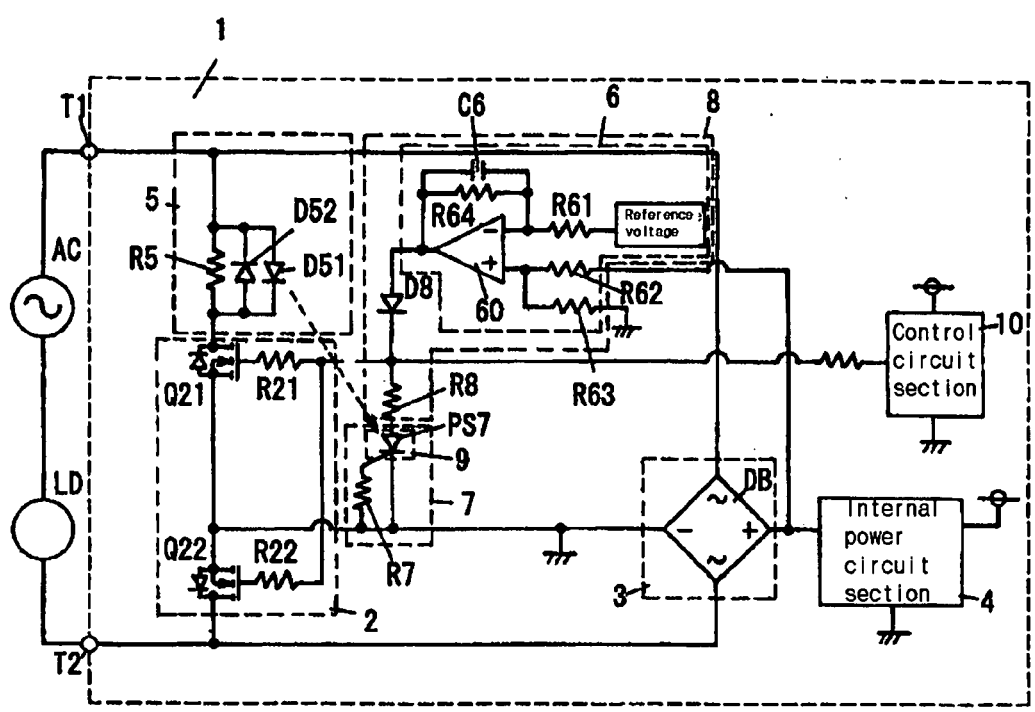
FIG. 20 is a circuit diagram illustrating an electronic switch according to a twelfth embodiment of the present invention.

FIG. 20 is a circuit diagram illustrating an electronic switch according to a twelfth embodiment of the present invention.

The electronic switch according to the twelfth embodiment is different from the tenth embodiment, as shown in FIG. 20, in that the overvoltage detection circuit section 6 comprises an error amplifier 60 for amplifying an error of the voltage level from the positive DC output terminal of the diode bridge DB about the overvoltage detection level such as the overvoltage restriction level, in place of the Zener diode ZD6, and in that the overvoltage protection circuit section 8 receives the output of the error amplifier 60 and outputs the signal for suppressing the voltage to the overvoltage restriction level to both control terminals of the self arc-suppressing elements Q21, Q22.

In FIG. 20, the overvoltage detection circuit section 6 comprises the error amplifier 60 of which the output terminal is connected to the anode of the diode D8, a resistor R61 provided between an reference voltage output terminal which becomes the overvoltage detection level such as the overvoltage restriction level and an inverted input terminal of the error amplifier 60, a resistor R62 provided between a non-inverted input terminal of the error amplifier 60 and the positive DC output terminal of the diode bridge DB, a resistor R63 provided between the non-inverted input terminal of the error amplifier 60 and the ground, a resistor R64 connected between the inverted input terminal and the output terminal of the error amplifier 60, and a capacitor C6 connected in parallel thereto. In this construction, the voltage of the positive DC output terminal of the diode bridge DB is divided into the resistors R62, R63, and input to the non-inverted input terminal of the error amplifier 60, where the error about the reference voltage is amplified.

Next, characteristic actions of the electronic switch according to the twelfth embodiment will be described. When the overcurrent and the overvoltage are not generated, the voltage input to the non-inverted input terminal of the error amplifier 60 becomes smaller than the reference voltage input to the inverted input terminal, so that the output signal of the error amplifier 60 becomes a low level. In this case, the phase control signal turns on and off the self arc-suppressing elements Q21, Q22 through normal actions, without influence of the overvoltage detection circuit section 6 and the overvoltage protection circuit section 8.

On the other hand, when the overcurrent reaching the overcurrent detection level is generated, the overcurrent detection circuit section 5 and the overcurrent protection circuit section 7 operate similarly to the tenth embodiment. Thereafter, when the overvoltage reaching the overvoltage detection level (overvoltage restriction level) is generated, the output signal of the error amplifier 60 becomes a high level, and the overvoltage protection circuit section 8 receives the output signal and outputs a signal for suppressing the voltage to the overvoltage restriction level to both control terminal of the self arc-suppressing elements Q21, Q22. That is, when the voltage between the terminal portions T1, T2 is raised and reaches the overvoltage detection level, the output signal of the error amplifier 60 becomes a high level, and turns on the self arc-suppressing elements Q21, Q22 through the overvoltage protection circuit section 8. As a result, when the voltage between the terminal portions T1, T2 is changed from the rising to the dropping and becomes smaller than the overvoltage detection level, the output signal of the error amplifier 60 becomes a low level, and turns off the self arc-suppressing elements Q21, Q22 through the overvoltage protection circuit section 8, so that the voltage between the terminal portions T1, T2 is suppressed to the overvoltage restriction level. These actions are repeated for the overvoltage detection time period when the overvoltage (the voltage between the terminal portions T1, T2 reaches the overvoltage detection level.

In the tenth embodiment, the overvoltage restriction level is varied in accordance with the deviation of the Zener voltage or the temperature characteristic, so that it is necessary to use the self arc-suppressing elements having the withstand voltage performance with predicted variation. However, in the twelfth embodiment, since the voltage between the terminal portions T1, T2 can be suppressed to the overvoltage restriction level with high accuracy, it is possible to use the self arc-suppressing elements lower in withstand voltage and cost, and also to prevent the self arc-suppressing elements from emitting heat.

Thirteenth Embodiment

Figure 21:
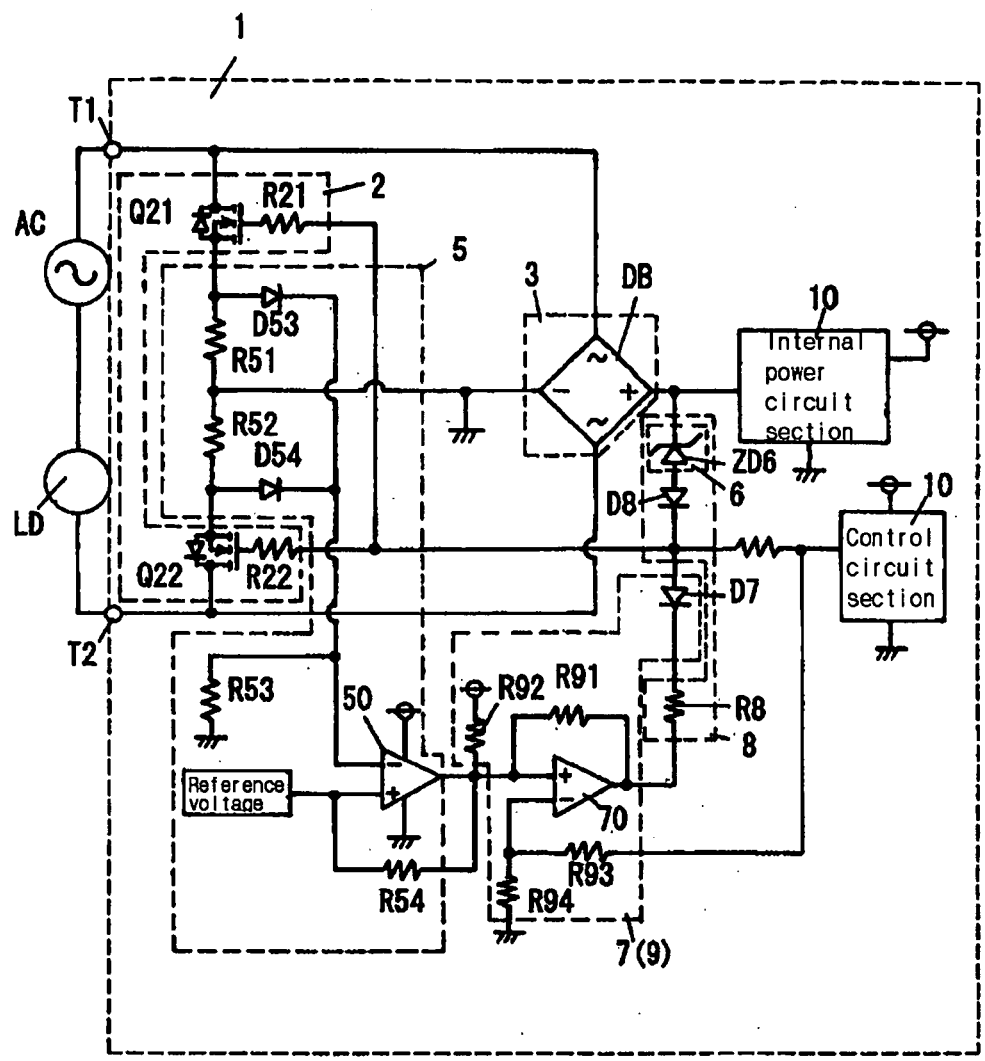
FIG. 21 is a circuit diagram illustrating an electronic switch according to a thirteenth embodiment of the present invention.
Figure 22:
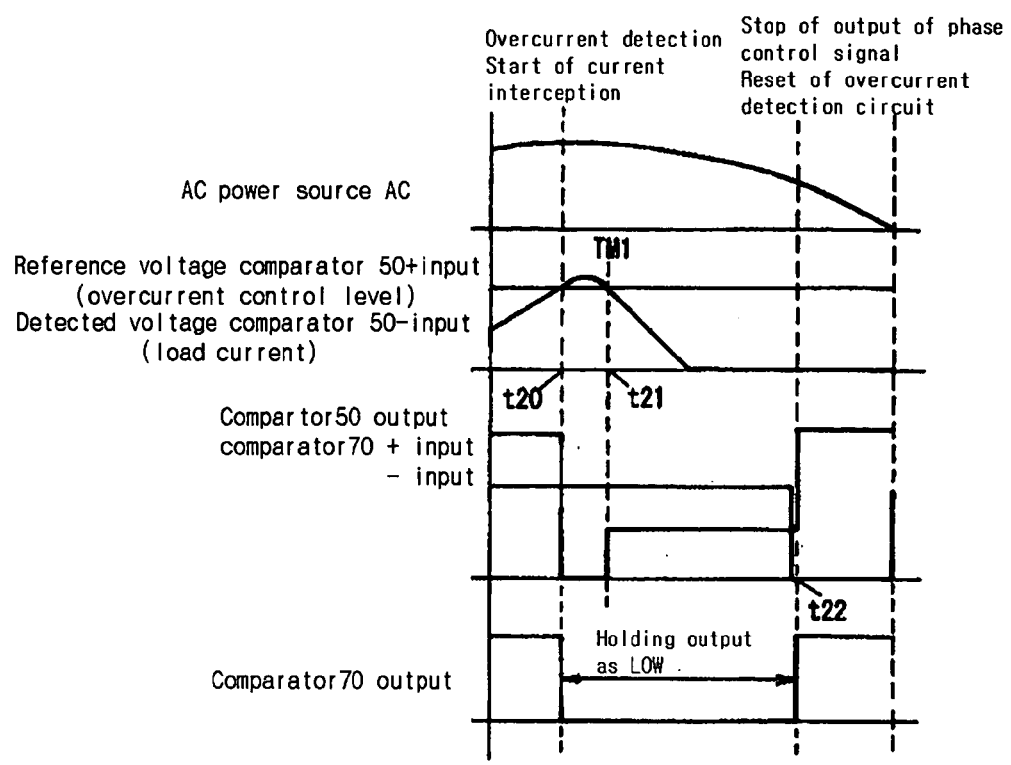
FIG. 22 is an operational waveform diagram of the electronic switch shown in FIG. 21 in an overcurrent mode.

FIG. 21 is a circuit diagram illustrating an electronic switch according to a thirteenth embodiment of the present invention, and FIG. 22 is an operational waveform diagram of the electronic switch shown in FIG. 21 in an overcurrent mode.

The electronic switch according to the thirteenth embodiment, as shown in FIG. 21, further comprises an overcurrent detection circuit section 5, an overcurrent protection circuit section 7, and an off holding circuit section 9 different from the tenth embodiment, in addition to the switch circuit section 2, the rectifier circuit section 3, the internal power circuit section 4, the overvoltage detection circuit section 6, the overvoltage protection circuit section 8, and the control circuit section 10 similar to any one of the tenth to twelfth embodiments.

The overcurrent detection circuit section 5 comprises a current-voltage converter which converts the current flowing between the pair of terminal portions T1, T2 into a voltage and has resistors (shunt resistors) R51, R52 and diodes D53, D54, a comparator 50 for outputting a signal indicating that the overcurrent detection level is reached, when the voltage converted through the current-voltage converter reaches a voltage (reference voltage) corresponding to the overcurrent detection level. That is, the output side of the overcurrent detection circuit section 5 includes the comparator having an open collector type output and the resistors R53, R54, and when the current flowing between the pair of terminal portions T1, T2 reaches the overcurrent detection level, the overcurrent detection circuit section outputs a signal of a low level, and otherwise, outputs a signal of a high level.

The overcurrent protection circuit section 7 and the off holding circuit section 9 uses a comparator 70 having an open collector type output in common. The output terminal of the comparator 70 is connected to both control terminals of the pair of self arc-suppressing elements Q21, Q22, such that the comparator extracts and holds the phase control signal to both control terminals of the pair of self arc-suppressing elements Q21, Q22 when the signal indicating that the overcurrent detection level is reached is output using the signal from the overcurrent detection circuit section 5 as one in put (the non-inverted input terminal in the figure), and the actions of extracting and holding the phase control signal by the off holding circuit section 9 is stopped when the phase control signal is stopped using the phase control signal as the other input (the inverted input terminal in the figure).

That is, the overcurrent protection circuit section 7 comprises the diode D7 and the comparator 70, and as shown in FIG. 22, outputs the signal of a low level to both control terminals of the self arc-suppressing elements Q21, Q22 when the output of the comparator 70 becomes a low level. On the other hand, the off holding circuit section 9 comprises the comparator 70 and the resistors R91 to R94, and when the output of the comparator 70 is changed from a low level to a high level, the signal of a high level being lower than the voltage level of the inverted input terminal and obtained by dividing the phase control signal from the control circuit section 10 with the resistors R93, R94 is input to the non-inverted input terminal, whereby the off holding circuit section holds the output of the comparator to a low level until the phase control signal becomes a low level. The signal, which becomes a high level by means of the voltage obtained by dividing the internal source voltage from the internal power circuit section 4 with the resistors R91, R93, is input to the non-inverted input terminal of the comparator 70. That is, resistance values of the resistors R91, R92 are set such that the signal of a high level becomes lower than the voltage level to the non-inverted input terminal of the comparator 70.

Next, characteristic actions of the electronic switch according to the thirteenth embodiment will be described. As shown in FIG. 22, when the overcurrent reaching the overcurrent detection level is generated and the current flowing between the terminal portions T1, T2 reaches the overcurrent detection level (t20), the output of the comparator 50 of the overcurrent detection circuit section 5 becomes a low level and the output of the comparator 70 of the overcurrent protection circuit section 7 becomes a low level, for the overcurrent detection time period TM1 when the overcurrent detection level is reached.

When the output of the comparator 70 becomes a low level, the phase control signal to both control terminals of the self arc-suppressing elements Q21, Q22 is extracted, and the gate voltages start the dropping. Then, with the dropping of the gate voltages, the voltage between the terminal portions T1, T2 are raised. Thereafter, when the overcurrent is changed from the rising to the dropping, the voltage between the terminal portions T1, T2 becomes higher than the source voltage of the AC power source AC. As a result, when the voltage between the terminal portions T1, T2 reaches the overvoltage detection level (the overvoltage restriction level), the Zener diode ZD6 repeats the turn-on and turn-off and the voltage between the terminal portions T1, T2 are suppressed to the overvoltage restriction level, for the overvoltage detection time period when the overvoltage detection level is reached. Then, when the overvoltage detection time period is finished, the voltage between the terminal portions T1, T2 is fixed to the level of the AC power source AC.

On the other hand, when the overcurrent is decreased and becomes lower than the overcurrent detection level t21, the signal input to the non-inverted input terminal of the comparator 70 from the comparator 50 becomes a high level, but is lower than the high level of the phase control signal input to the inverted input terminal of the comparator 70, so that the output of the comparator 70 is held to a low level and is changed to a high level at the timing when the phase control signal becomes a low level.

According to the thirteenth embodiment, since the overcurrent detection circuit section 5 comprises the current-voltage converter and the comparator 50, it is possible to detect whether the current flowing between the pair of terminal portions T1, T2 reaches the overcurrent detection level with high accuracy. As a result, it is possible to use the self arc-suppressing elements having lower withstood current and lower cost, and also to suppress the self arc-suppressing elements from emitting heat.

Further, in the construction using the photo thyristor coupler, since the response speed of the photo thyristor PS7 is low, it is not possible to instantly switch over to the on state. However, in the thirteenth embodiment, the overcurrent detection circuit section 5 can instantly switch over to the state where the output is low.

Furthermore, in the construction using the photo thyristor coupler, the light emitting timings of the light emitting diodes are different from each other, the light quantity required for triggering the photo thyristor PS7 has deviation, and the deviation is influenced by the surrounding temperature. On the contrary, in the thirteenth embodiment, accurate actions of which the deviation is suppressed using the reference voltage are possible.

Furthermore, since it is possible to simply construct the overcurrent protection circuit section 7 and the off holding circuit section 9 by using the comparator 70, etc., the downsizing is possible.

Fourteenth Embodiment

Figure 23:
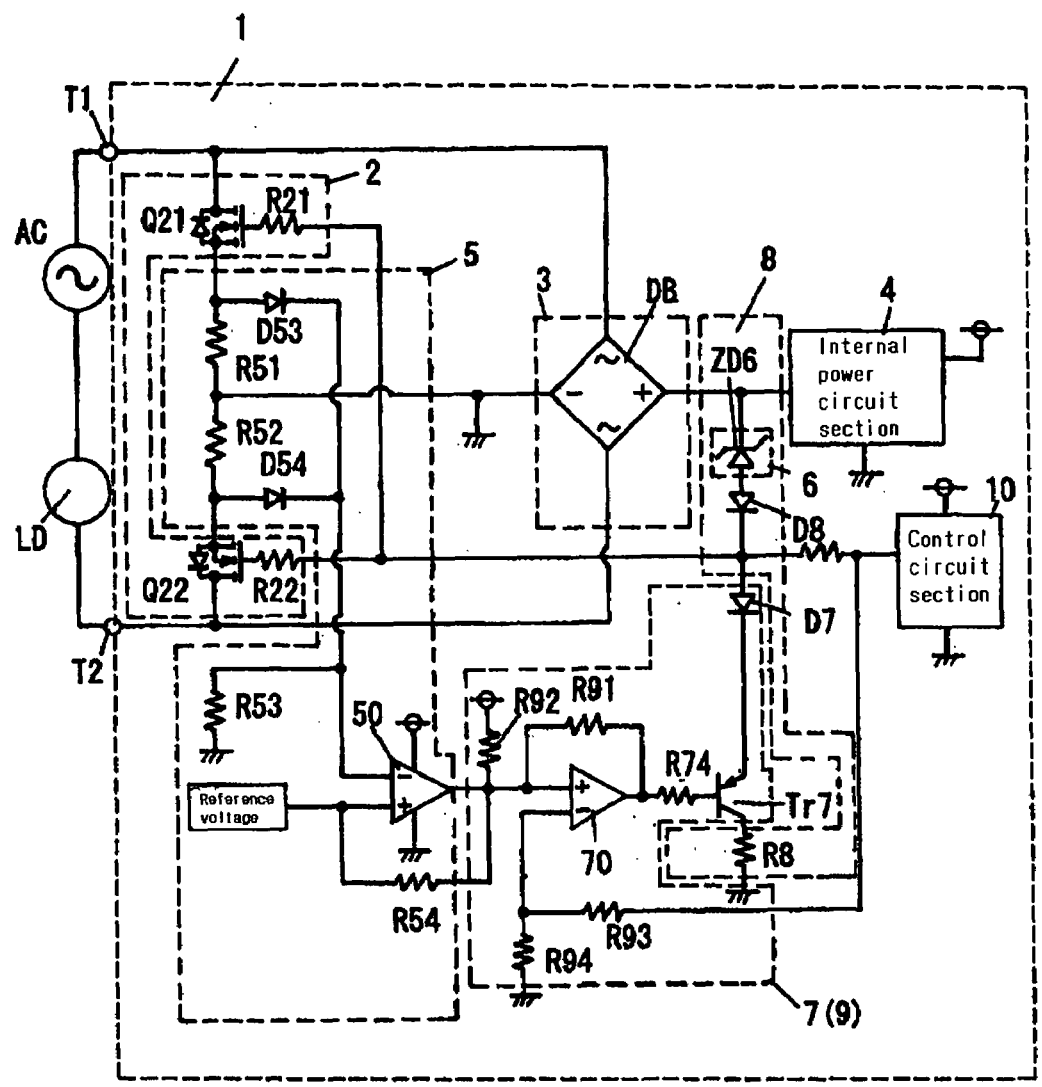
FIG. 23 is a circuit diagram illustrating an electronic switch according to a fourteenth embodiment of the present invention.

FIG. 23 is a circuit diagram illustrating an electronic switch according to a fourteenth embodiment of the present invention.

The electronic switch according to the fourteenth embodiment is different from the thirteenth embodiment, as shown in FIG. 23, in that the overcurrent protection circuit section 7 comprises a PNP transistor Tr7 provided between the control terminal side of the pair of self arc-suppressing elements Q21, Q22 and the ground, and the output terminal of the comparator 70 is connected to the control terminal (base) of the transistor Tr7. More specifically, the transistor Tr7 is provided between a diode D7 and a resistor R8, and the emitter and the base of the transistor Tr7 are connected to the cathode of the diode D7 and the resistor R74, respectively. In addition, the resistor R8 is provided between the collector of the transistor Tr7 and the ground.

In the thirteenth embodiment, the phase control signal is extracted directly from the output of the comparator 70. However, in a case where the comparator 70 has an IC construction, its electrostatic capacitance is limited, and thus it is not possible to rapidly extract the gate current due to a relatively large electrostatic capacitance of the gate terminals of the self arc-suppressing elements Q21, Q22, so that it is not possible to instantly switch over to the current intercepting action.

On the contrary, in the fourteenth embodiment, since the responsibility of extracting the phase control signal to both control terminals of the pair of self arc-suppressing elements Q21, Q22 can be enhanced by providing the transistor Tr7, the overcurrent being rapidly raised due to the load short-circuit, etc. can be restricted to a small current value to intercept the current, so that it is possible to use the self arc-suppressing elements lower in cost and size.

Fifteenth Embodiment

Figure 24:
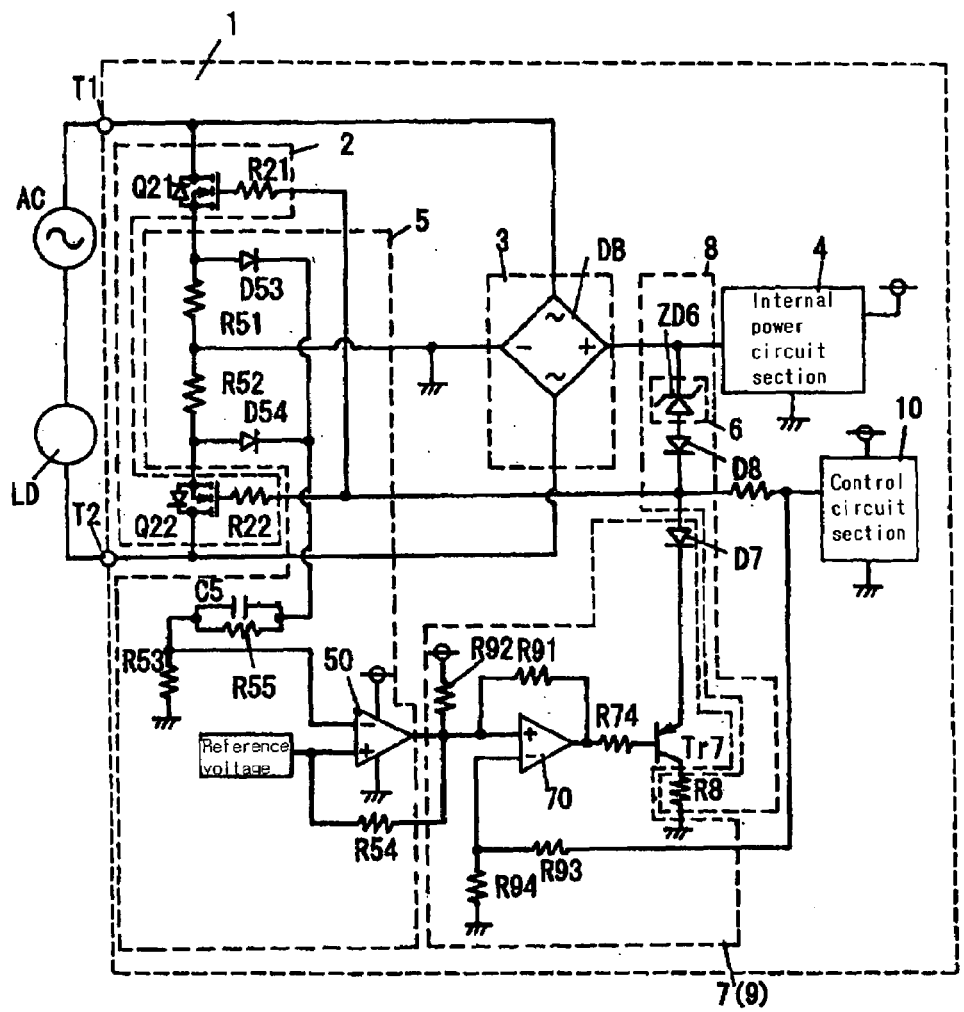
FIG. 24 is a circuit diagram illustrating an electronic switch according to a fifteenth embodiment of the present invention.
Figure 25:
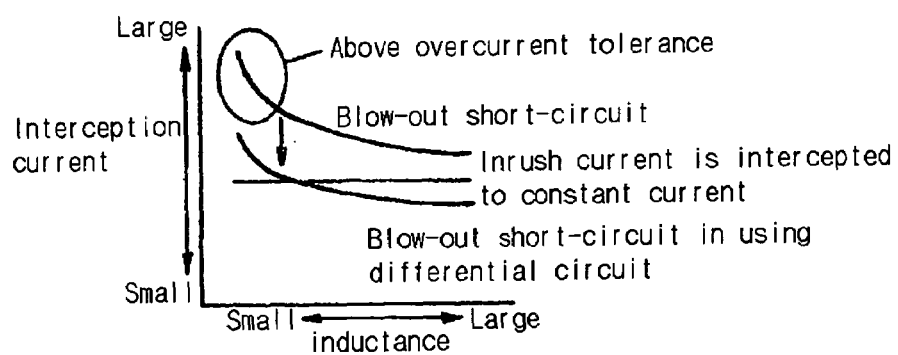
FIG. 25 is a graph illustrating relationship between inductance and overcurrent tolerance.

FIG. 24 is a circuit diagram illustrating an electronic switch according to a fifteenth embodiment of the present invention, and FIG. 25 is a graph illustrating relationship between inductance and overcurrent tolerance.

The electronic switch according to the fifteenth embodiment is different from the thirteenth and fourteenth embodiments (the fourteenth embodiment in the example of FIG. 24), as shown in FIG. 24, in that the overcurrent detection circuit section 5 comprises a differential circuit section for differentiating the voltage converted through the current-voltage converter between the current-voltage converter and the comparator 50. The differential circuit section comprises a resistor R53, a resistor R55 provided between a connection point of the resistor R53 and the inverted input terminal of the comparator 50 and the output (both cathodes of the diodes D53, D54) of the current-voltage converter, and a capacitor C5 connected in parallel to the resistor R55.

Here, the inrush current when the self arc-suppressing elements Q21, Q22 are turned on with the zero cross of the AC power source AC is increased with increase of the AC power source AC. Since the frequency of the AC power source AC is usually 50 Hz or 60 Hz, the increase of the inrush current is relatively slowed down. Therefore, even when the AC power source AC and the inductance of the wiring cable thereto are varied, it is possible to intercept the overcurrent into a constant current value.

However, as shown in FIG. 25, the small inductance causes the overcurrent to be rapidly increased. Therefore, if much time is taken to extract the current due to the electrostatic capacitance of the gates of the self arc-suppressing elements Q21, Q22, the voltage of the AC power source AC is large when the self arc-suppressing elements Q21, Q22 are turned on, and when the overcurrent is generated due to the blow-out or the load short-circuit, there occurs a problem that the overcurrent becomes too large.

According to the fifteenth embodiment, in a case where the inductance is small, even when the overcurrent being rapidly raised is generated, the overcurrent small enough can be determined as the overcurrent by providing the differential circuit section, so that it is possible to compensate for the delayed operation due to the extraction of the gate current and also to prevent the overcurrent from becoming too large. As a result, it is possible to protect the self arc-suppressing elements Q21, Q22 from the overcurrent.

Sixteenth Embodiment

Figure 26:
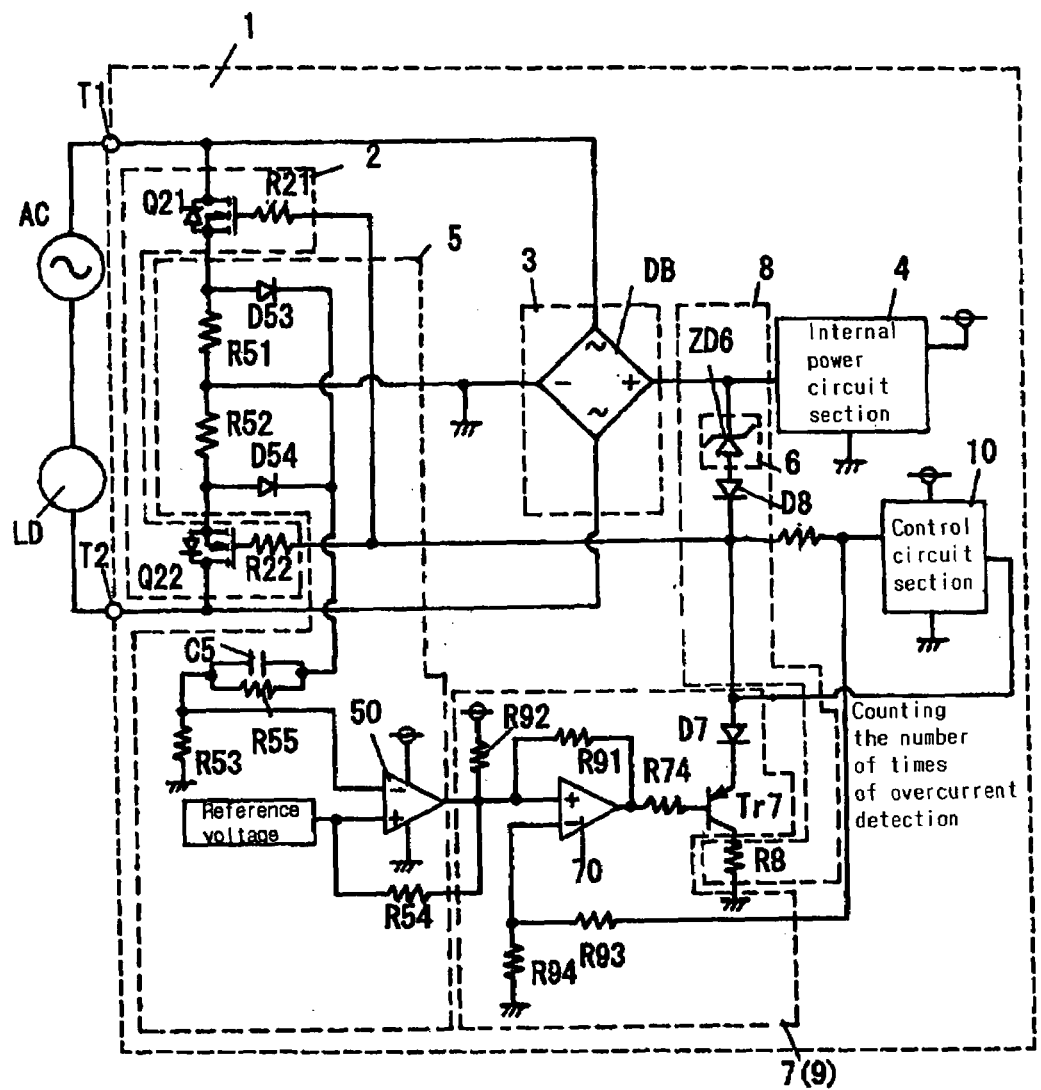
FIG. 26 is a circuit diagram illustrating an electronic switch according to a sixteenth embodiment of the present invention.

FIG. 26 is a circuit diagram illustrating an electronic switch according to a sixteenth embodiment of the present invention.

The electronic switch according to the sixteenth embodiment is different from the tenth to fifteenth embodiments (the fifteenth embodiment in the example of FIG. 26), as shown in FIG. 26, in that the control circuit section 10 comprises coun ting means (not shown) for counting the number of times when the overcurrent detection circuit section 5 detects in a predetermined unit time that the overcurrent detection level is reached, and when the number of times per unit time counted by the counting means reaches a predetermined number, the control circuit section 10 stops the output of the phase control signal to both control terminals of the pair of self arc-suppressing elements Q21, Q22. In the figure, by monitoring the voltage of the anode of the diode D7 (the dropping of the gate voltages of the self arc-suppressing elements), the number of times is counted.

According to the sixteenth embodiment, since any disorder can be considered as being generated when the number of times per unit time reaches the predetermined number, it is possible to prevent the electronic switch from operating in a state where a disorder can be considered as being generated by stopping the output of the phase control signal, and in addition, it is possible to reduce the power consumption.

Seventeenth Embodiment

Figure 27:
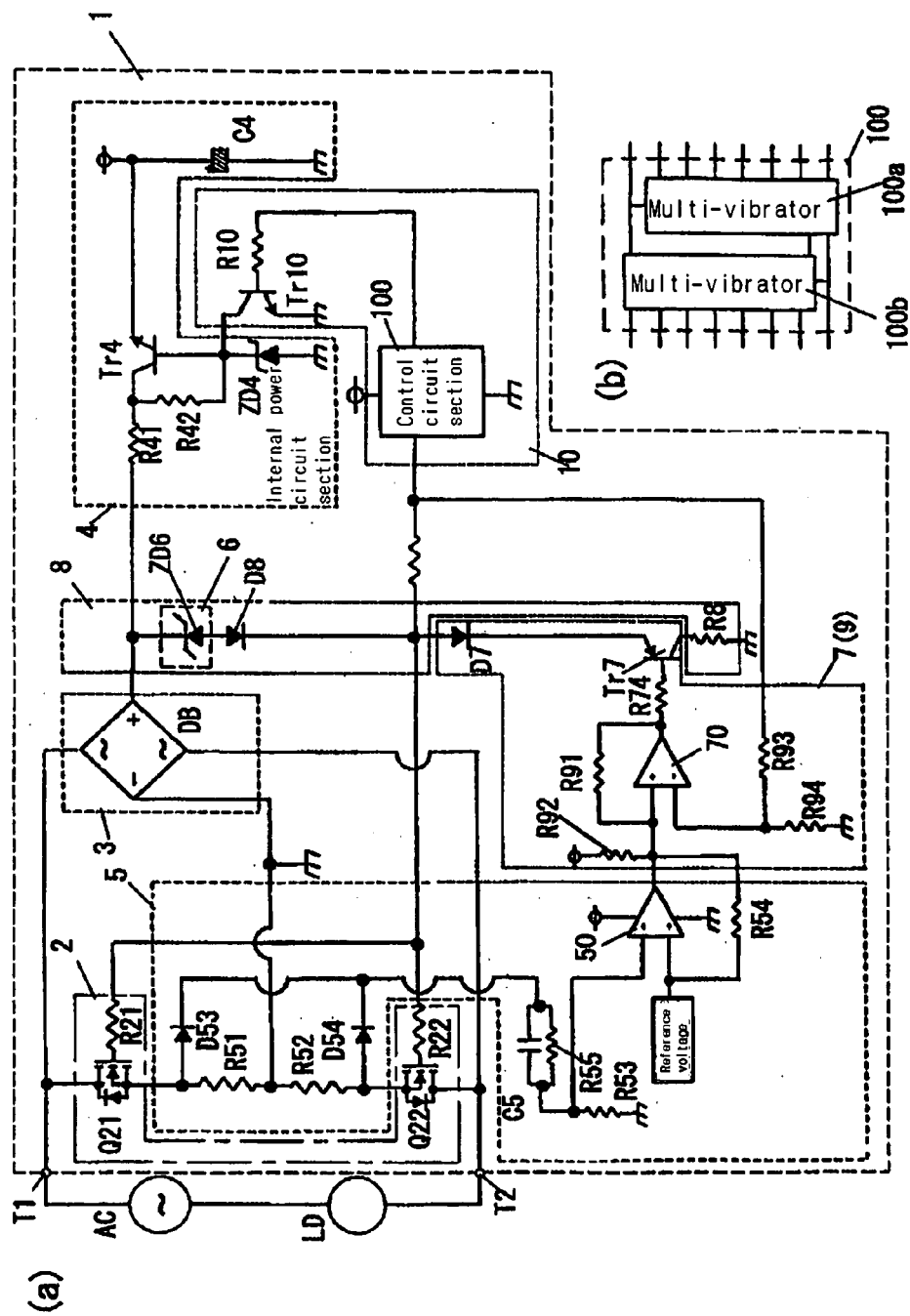
FIG. 27A is a circuit diagram illustrating an electronic switch according to a seventeenth embodiment of the present invention.
FIG. 27B is a circuit diagram illustrating an example of a control circuit section in the electronic switch shown in FIG. 27A.
Figure 28:
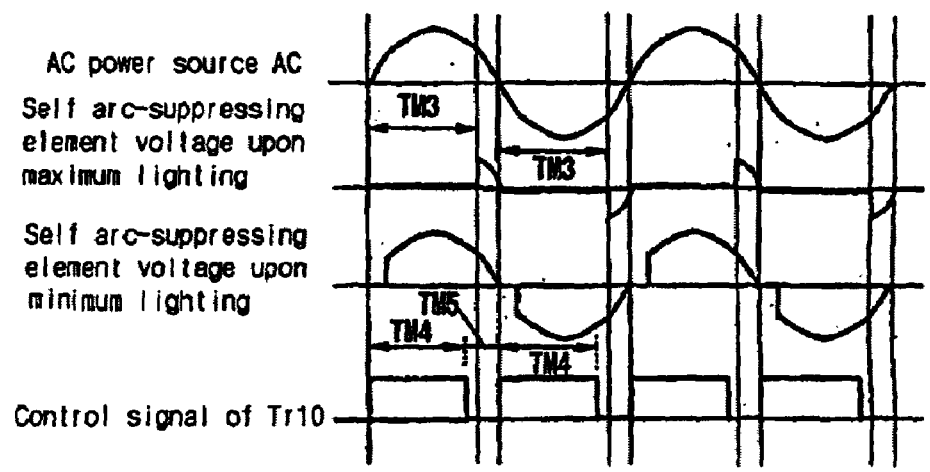
FIG. 28 is an operational waveform diagram of the electronic switch shown in FIG. 27A.
Figure 29:
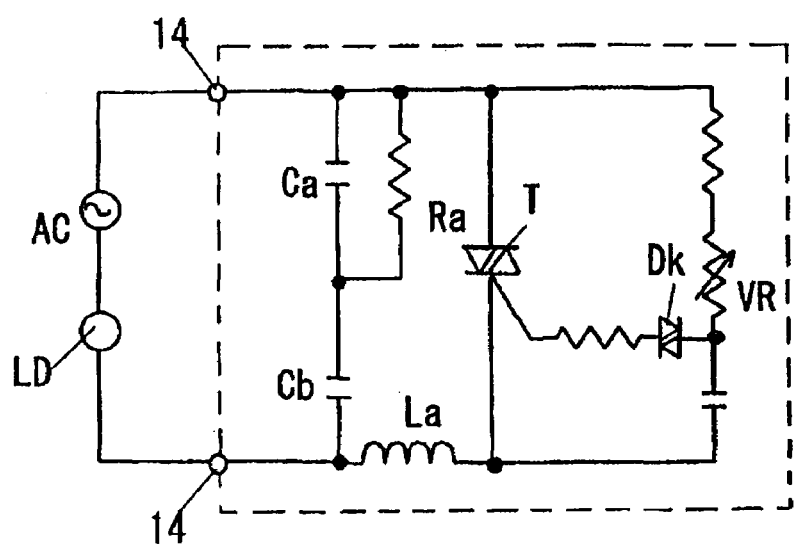
FIG. 29 is a circuit diagram illustrating a conventional electronic switch.

FIG. 27A is a circuit diagram illustrating an electronic switch according to a seventeenth embodiment of the present invention, FIG. 27B is a circuit diagram illustrating an example of a control circuit section in the electronic switch shown in FIG. 27A, and FIG. 28 is an operational waveform diagram of the electronic switch shown in FIG. 27A.

In a case where the load LD is an illuminating equipment, only the small "self arc-suppressing element voltage upon maximum lighting" shown in FIG. 28 is applied to the self arc-suppressing elements (between the terminal portions T1, T2), when the load LD is lighted in maximum. When the load is lighted in minimum, the large "self arc-suppressing element voltage upon minimum lighting" shown in FIG. 28 is applied to the self arc-suppressing elements (between the terminal portions T1, T2, so that the output voltage of the diode bridge for rectifying and outputting the voltage between the terminal portions T1, T2 is raised and the raised voltage is applied to the internal power circuit section 4.

For the turn-on time period TM3 of the self arc-suppressing elements Q21, Q22 such as right before the finishing, in a case where the internal power circuit section 4 is made to operate so as to secure more power using the small "self arc-suppressing element voltage upon maximum lighting", if the "self arc-suppressing element voltage upon minimum lighting" is too raised over the "self arc-suppressing element voltage upon maximum lighting" as described above, the temperature of an element (a transistor Tr4 described later) in the internal power circuit section 4 is increased, so that another countermeasure for heating is necessary. However, since the size of the electronic switch is limited, the enlargement of the heat sink 16 shown in FIG. 2 is limited.

The electronic switch according to the seventeenth embodiment is different from the tenth to sixteenth embodiments (the sixteenth embodiment in the example of FIG. 27), as shown in FIG. 27, in that the countermeasure for heating is that the control circuit section 10 allows the internal power circuit section 4 to intermittently operate, where the internal power circuit section 4 stabilizes the DC voltage between both DC output terminals of the diode bridge DB and generates the internal source voltage.

The internal power circuit section 4 comprises a Zener diode ZD4 of which the anode is grounded, a resistor R41, a transistor Tr4 of which one end (collector) is connected to the positive DC output terminal of the diode bridge DB through the resistor and of which the control terminal (base) is connected to the negative DC output terminal of the diode bridge DB through the Zener diode ZD4, a resistor R42 connected between the collector and the base, and a smoothing capacitor C4 connected between the other end and the control terminal of the other end (emitter) of the transistor Tr4. The transistor Tr4 is not limited to the bipolar transistor, but may be, for example, a Bi-CMOS type transistor.

The control circuit section 10 comprises a switching element (a transistor in the figure) Tr10 for intermittent operation connected between the control terminal of the transistor Tr4 of the internal power circuit section 4 and the negative DC output terminal of the diode bridge DB, and a resistor R10 provided between the base of the switching element and the output of a multi-vibrator 100a, in addition to the control section 100 comprising a CMOS-IC having two built-in multi-vibrators 100a, 100b.

In the control section 100, the multi-vibrator 100a, as shown in FIG. 28, turns on the switching element Tr10 for a partial time period TM4 of the time period TM3 when the pair of self arc-suppressing elements Q21, Q22 are turned on by means of the aforementioned phase control signal output from the other multi-vibrator 100b, and turns off the switching element Tr10 for the time period TM5 other than the partial time period.

According to the seventeenth embodiment, in a case where the load LD is an illuminating equipment and the illuminating equipment is lighted in minimum, the operation of the transistor Tr4 of the internal power circuit section 4 is stopped for the partial time period TM4 of the time period TM3 when the voltage between the pair of terminal portions T1, T2 is raised, even when the voltage between the pair of terminal portions T1, T2 is raised and thus the voltage between both DC output terminals of the diode bridge DB is raised, so that it is possible to suppress the transistor Tr4 from emitting heat.

According to the present invention as described in the above, it is possible to instantly release the overcurrent from flowing between the pair of terminal portions.

Hitherto, although the present invention has been particularly described with reference to several exemplary embodiments thereof, the present invention is not limited to the combination and arrangement of the constituent elements in the exemplary embodiments, but the combination and arrangement of the constituent elements in the embodiments can be modified without departing from the spirit and scope of the present invention as defined by the appended claims.

What is claimed is:

1. An electronic switch, which has a self arc-suppressing element connected between a pair of terminal portions to which AC current is applied trough a load, and which turns on or turn off the self arc-suppressing element with a phase control signal, the electronic switch comprising:

overcurrent detection means for detecting whether current flowing between the pair of terminal portions reaches overcurrent larger than predetermined current; and overcurrent protection means for extracting the phase control signal to a control terminal of the self arc-suppressing element, when the overcurrent detection means detects that the overcurrent has been reached, wherein as the self arc-suppressing element, a pair of self arc-suppressing elements having a one-way on and off control construction are connected an inverse-series between the pair of terminal portions, wherein the electronic switch further comprises a resistor as the overcurrent detection means which is provided between the pair of terminal portions and is connected in series to the pair of self arc-suppressing elements, and a switching element as the overcurrent protection means for extracting control voltages applied to the control terminals of the self arc-suppressing elements upon driving, wherein the switching element is driving with a voltage across the resistor generated when the overcurrent larger than the predetermined current flows through the resistor, and wherein first and second shunt resistors are the resistor are connected in series between first and second arc-suppressing elements as the pair of self arc suppressing elements, and first and second switching elements as the switching element are connected in series between the control terminals of the first and second self arc-suppressing elements, wherein a connection point of the first and second shunt resistors and a connection point of the first and second switching elements are connected each other, the control terminal of the first switching element is connected to a connection point of the first self arc-suppressing element and the first shunt resistor, and the control terminal of the second switching element is connected to a connection point of the second self arc-suppressing element and the second shunt resistor, and wherein the first and second switching elements are driven with the voltages across the first and second shunt resistors generated when the overcurrent flows through the first and second shunt resistors.

2. An electronic switch, which has a self arc-suppressing element connected between a pair of terminal portions to which AC current is applied through a load, and which turns on or turns off the self arc-suppressing element with a phase control signal, the electronic switch comprising:

overcurrent detection means for detecting whether current flowing between the pair of terminal portions reaches overcurrent larger than predetermined current; and overcurrent protection means for extracting the phase control signal to a control terminal of the self arc-suppressing element, when the overcurrent detection means detects that the overcurrent has been reached, wherein as the self arc-suppressing element, a pair of self arc-suppressing elements having a one-way on and off control construction are connected in inverse-series between the pair of terminal portions, wherein the electronic switch further comprises a resistor as the overcurrent detection means which is provided between the pair of terminal portions and is connected in series to the pair of self arc-suppressing elements, and a switching element as the overcurrent protection means for extracting control voltages applied to the control terminals of the self arc-suppressing elements upon driving, wherein the switching element is driven with a voltage across the resistor generated when the overcurrent larger than the predetermined current flows through the resistor, and wherein between the pair of terminal portions and first and second self arc-suppressing elements as the pair of self arc-suppressing elements, first and second shunt resistors as the resistor are provided, respectively, and first and second photo couplers each having a photo switching element as the switching element and a light emitting diode are further provided, wherein the light emitting diodes of the first and second photo couplers are connected in parallel to the first and second shunt resistors, respectively, the photo switching elements of the first and second photo couplers are connected in series between the control terminals of the first and second self arc-suppressing elements, respectively, a connection point of the first and second self arc-suppressing elements and a connection point of the photo switching elements of the first and second photo couplers are connected each other, and the control terminals of the photo switching elements of the first and second photo couplers are connected to both of the connection points, wherein the photo switching elements of the first and second photo couplers are driven, respectively, by driving the light emitting diodes of the first and second photo couplers with the voltages across the first and second shunt resistors generated when the overcurrent flows through the first and second shunt resistors.

3. An electronic switch, which has a self arc-suppressing element connected between a pair of terminal portions to which AC current is applied through a load, and which turns on or turns off the self arc-suppressing element with a phase control signal, the electronic switch comprising:

overcurrent detection means for detecting whether current flowing between the pair of terminal portions reaches overcurrent larger than predetermined current; and overcurrent protection means for extracting the phase control signal to a control terminal of the self arc-suppressing element, when the overcurrent detection means detects that the overcurrent has been reached, wherein as the self arc-suppressing element, a pair of self arc-suppressing elements having a one-way on and off control construction are connected in inverse-series between the pair of terminal portions, wherein the electronic switch further comprises a resistor as the overcurrent detection means which is provided between the pair of terminal portions and is connected in series to the pair of self arc-suppressing elements, and a switching element as the overcurrent protection means for extracting control voltages applied to the control terminals of the self arc-suppressing elements upon driving, wherein the switching element is driven with a voltage across the resistor generated when the overcurrent larger than the predetermined current flows through the resistor, and wherein between one terminal portion of the pair of terminal portions and one self arc-suppressing element connected to the one terminal portion of the pair of self arc-suppressing elements, the resistor is provided and a photo coupler having a photo switching element as the switching element and a pair of light emitting diodes connected in inverse-parallel is further provided, wherein the pair of light emitting diodes are connected in parallel to the resistor, the photo switching element is connected between the control terminals of the pair of self arc-suppressing elements and a connection point of the pair of self arc-suppressing elements, and the control terminals of the photo switching element is connected to the connection point, and wherein the photo switching element is driven by driving the pair of light emitting diodes with the voltage across the resistor generated when the overcurrent flows through the resistor.

4. An electronic switch, which has a self arc-suppressing element connected between a pair of terminal portions to which AC current is applied through a load, and which turns on or turns off the self arc-suppressing element with a phase control signal, the electronic switch comprising:

overcurrent detection means for detecting whether current flowing between the pair of terminal portions reaches overcurrent larger than predetermined current; and overcurrent protection means for extracting the phase control signal to a control terminal of the self arc-suppressing element, when the overcurrent detection means detects that the overcurrent has been reached, wherein as the self arc-suppressing element, a pair of self arc-suppressing elements having a one-way on and off control construction are connected in inverse-series between the pair of terminal portions, wherein the electronic switch further comprises a resistor as the overcurrent detection means which is provided between the pair of terminal portions and is connected in series to the pair of self arc-suppressing elements, and a switching element as the overcurrent protection means for extracting control voltages applied to the control terminals of the self arc-suppressing elements upon driving, wherein the switching element is driven with a voltage across the resistor generated when the overcurrent larger than the predetermined current flows through the resistor, and wherein between one terminal portion of the pair of terminal portions and one self arc-suppressing element connected to the one terminal portion of the pair of self arc-suppressing elements and between the control terminals of the pair of self arc-suppressing elements and a connection point of the pair of self arc-suppressing elements, the resistor and the switching element are provided, respectively, and a photo coupler having a photo switching element and a pair of light emitting diodes connected in inverse-parallel is further provided, wherein the pair of light emitting diodes are connected in parallel to the resistor, and the photo switching element is connected between the control terminal of the switching element and a driving source, and wherein the switching element is driven by driving the pair of light emitting diodes with the voltage across the resistor generated when the overcurrent flows through the resistor to drive the photo switching element.

5. The electronic switch according to claim 4, further comprising first, second, and third resistors, first and second diodes, and a thyristor as the switching element, wherein one ends of the first resistor, the second resistor, and the thyristor are each connected to the control terminals of the pair of self arc-suppressing elements, the first diode is connected such that the first resistor is separated from the control terminals of the pair of self arc-suppressing elements when the pair of self arc-suppressing elements are turned off, the second diode is connected such that the second resistor is separated from the control terminals of the pair of self arc-suppressing elements when the pair of self arc-suppressing elements are turned on, and the third resistor is connected to one end of the thyristor to secure latch holding current.

6. An electronic switch, which has a self arc-suppressing element, and which turns on or turns off the self arc-suppressing element with a phase control signal, the electronic switch comprising:
a pair of terminal portions to which AC current is applied through a load; overcurrent detection means for detecting whether current flowing between the pair of terminal portions reaches overcurrent larger than predetermined current;
overcurrent protection means for extracting the phase control signal to a control terminal of the self arc-suppressing element, when the overcurrent detection means detects that the overcurrent has been reached;
a diode bridge having AC input terminals connected to the pair of terminal portions, and DC output terminals between which the self arc-suppressing element is connected; and
a resistor as the overcurrent detection means provided between the DC output terminals of the diode bridge and connected in series to the self arc-suppressing element,
wherein the overcurrent protection means turns off the self arc-suppressing element with the voltage across the resistor generated when the overcurrent larger than the predetermined current flows through the resistor.

7. An electronic switch, which has a self arc-suppressing element connected between a pair of terminal portions to which AC current is applied through a load, and which turns on or turns off the self arc-suppressing element with a phase control signal, the electronic switch comprising:
overcurrent detection means for detecting whether current flowing between the pair of terminal portions reaches overcurrent larger than predetermined current;
overcurrent protection means for extracting the phase control signal to a control terminal of the self arc-suppressing element, when the overcurrent detection means detects that the overcurrent has been reached;
overvoltage detection means for detecting whether the voltage applied between the pair of terminal portions reaches at least an overvoltage detection level higher than the voltage of the AC power source; and
overvoltage protection means for outputting a signal for suppressing the voltage between the pair of terminal portions to an overvoltage restriction level higher than the AC source voltage and lower than a withstand voltage of the self arc-suppressing element, to the control terminal of the self arc-suppressing element, independently of the phase control signal when the overvoltage detection means detects that the overvoltage has been reached.

8. The electronic switch according to claim 7, further comprising off holding means for holding the turned-off state of the self arc-suppressing element for a time period from a timing when the overcurrent detection means does no detect that the overcurrent has been reached to a timing when the phase control signal is changed to a signal for turning off the self arc-suppressing element.

9. The electronic switch according to claim 8, wherein as the self arc-suppressing element, a pair of self arc-suppressing elements having a one-way on and off control construction are connected in inverse-series between the pair of terminal portions, wherein the electronic switch further comprises a diode bridge of which both AC input terminals are connected to the pair of terminal portions and of which a negative DC output terminal is connected between the pair of self arc-suppressing elements, and wherein the overvoltage detection means includes a Zener diode of which the cathode and the anode are connected to a positive DC current output terminal of the diode bridge and both control terminals of the pair of self arc-suppressing elements, respectively, and of which a Zener voltage becomes a voltage corresponding to the overvoltage detection level.

10. The electronic switch according to claim 8, wherein as the self arc-suppressing element, a pair of self arc-suppressing elements having a one-way on and off control construction are connected in inverse-series between the pair of terminal portions, wherein the electronic switch further comprises a diode bridge of which both AC input terminals are connected to the pair of terminal portions and of which a negative DC output terminal is connected between the pair of self arc-suppressing elements, wherein the overvoltage detection means comprises an error amplifier for amplifying an error amount of the voltage level from a positive DC output terminal of the diode bridge with respect to the overvoltage detection level such as the overvoltage restriction level, and wherein the overvoltage protection means receives the output of the error amplifier and outputs a signal for suppressing the output to the overvoltage restriction level.

11. The electronic switch according to claim 8, wherein as the self arc-suppressing element, a pair of self arc-suppressing elements having a one-way on and off control construction are connected in inverse-series between the pair of terminal portions, wherein the overcurrent detection means comprises a current-voltage converter for converting current flowing between the pair of terminal portions into a voltage and a pair of light emitting diodes connected in inverse-parallel for emitting light when the voltage converted through the current-voltage converter reaches a voltage corresponding to the overcurrent detection level which is the predetermined current level, and wherein the overcurrent protection means and the off holding means use in common a photo thyristor of which a cathode and an anode are connected between the pair of self arc-suppressing elements and to both control terminals of the pair of self arc-suppressing elements, respectively, and which is turned on through the light emitting of the light emitting diode.

12. The electronic switch according to claim 8, wherein as the self arc-suppressing element, a pair of self arc-suppressing elements having a one-way on and off control construction are connected in inverse-series between the pair of terminal portions, and wherein the overcurrent detection means comprises a current-voltage converter for converting current flowing between the pair of terminal portions into a voltage, and a comparator for outputting a signal indicating that the overcurrent has been reached, when the voltage converted through the current-voltage converter reaches the voltage corresponding to the overcurrent detection level which is the predetermined current level.

13. The electronic switch according to claim 12, wherein the overcurrent protection means and the off holding means use the comparator in common, and the output terminal of the comparator is connected to both control terminals of the pair of self arc-suppressing elements, such that the phase control signal to both control terminals of the pair of self arc-suppressing elements is extracted and held when the signal indicating that the overcurrent has been reached is output using the signal from the overcurrent detection means as one input, and the extracting and holding of the phase control signal by the off holding means is stopped when the phase control signal is stopped using the phase control signal as the other input.

14. The electronic switch according to claim 13, wherein the overcurrent protection means comprises a switching element provided between both control terminals of the pair of self arc-suppressing elements and the ground, and the output terminal of own comparator is connected to the control terminal of the switching element.

15. The electronic switch according to claim 12, wherein the overcurrent detection means comprises a differential circuit section for differentiating the voltage converted through own current-voltage converter, the differential circuit section being provided between own current-voltage converter and the comparator.

16. The electronic switch according to claim 7, further comprising counting means for counting the number of times per a predetermined unit time when the overcurrent detection means detects that the overcurrent has been reached, wherein when the number of times per a unit time counted by the counting means reaches a predetermined number, the output of the phase control signal to both control terminals of the pair of self arc-suppressing elements is stopped.

17. The electronic switch according to claim 7, wherein as the self arc-suppressing element, a pair of self arc-suppressing elements having a one-way on and off control construction are connected in inverse-series between the pair of terminal portions, wherein the electronic switch further comprises:

a diode bridge of which both AC input terminals are connected to the pair of terminal portions and of which a negative DC output terminal is connected between the pair of self arc-suppressing elements;

an internal power circuit section comprising a transistor of which one end is connected to a positive DC output terminal of the diode bridge and of which the control terminal is connected to the negative DC output terminal of the diode bridge, and a smoothing capacitor connected between the control terminal and the other end of the transistor, the internal power circuit section stabilizing a DC voltage from between both DC output terminals of the diode bridge and generating internal power;

a switching element for intermittent action connected between the control terminal of the transistor of the internal power circuit section and the negative DC output terminal of the diode bridge; and a control section for outputting the phase control signal, and wherein the control section turns on the switching element for intermittent action for a part of a time period when the pair of self arc-suppressing elements are turned on by means of the phase control signal, and turns off the switching element for intermittent action for a time period other than the part of a time period.

* * * * *

UNITED STATES PATENT AND TRADEMARK OFFICE
CERTIFICATE OF CORRECTION

| | | |
|---|---|---|
| PATENT NO. | : 7,283,344 B2 | Page 1 of 1 |
| APPLICATION NO. | : 10/875526 | |
| DATED | : October 16, 2007 | |
| INVENTOR(S) | : Tatsuya Mukai et al. | |

It is certified that error appears in the above-identified patent and that said Letters Patent is hereby corrected as shown below:

In Claim 1, column 30, line 18, the word "trough" should be --through--.

In Claim 1, column 30, line 30, the word "an" should be --in--.

In Claim 1, column 30, line 43, before the word "the" the word "are" should be --as--.

In Claim 1, column 30, line 44, after the word "second" the word "self" is erroneously missing.

Signed and Sealed this

Fourth Day of March, 2008

JON W. DUDAS
*Director of the United States Patent and Trademark Office*